(12) United States Patent
Arisawa

(10) Patent No.: US 7,248,114 B2
(45) Date of Patent: Jul. 24, 2007

(54) CONTACTLESS IC CARD SYSTEM

(75) Inventor: Shigeru Arisawa, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/424,161

(22) Filed: Jun. 14, 2006

(65) Prior Publication Data

US 2006/0220759 A1    Oct. 5, 2006

Related U.S. Application Data

(62) Division of application No. 11/226,562, filed on Sep. 14, 2005, which is a division of application No. 10/886,745, filed on Jul. 8, 2004, now Pat. No. 7,016,432, which is a division of application No. 10/442,736, filed on May 21, 2003, now Pat. No. 6,784,730, which is a division of application No. 09/751,140, filed on Dec. 29, 2000, now Pat. No. 6,586,988, which is a division of application No. 09/327,757, filed on Jun. 7, 1999, now Pat. No. 6,198,361.

(30) Foreign Application Priority Data

Jun. 10, 1998    (JP)    ................... 10-162274

(51) Int. Cl.
*H03F 3/217*    (2006.01)
(52) U.S. Cl. .................. 330/251; 330/207 A
(58) Field of Classification Search ............ 330/207 A, 330/251
See application file for complete search history.

(56) References Cited

U.S. PATENT DOCUMENTS 6,072,361 A * 6/2000 Myers et al. ................. 330/10

* cited by examiner

*Primary Examiner*—Steven Mottola
(74) *Attorney, Agent, or Firm*—Bell, Boyd & Lloyd LLP

(57) ABSTRACT

In a contactless IC card system, a modulating circuit manufactured in an IC form is operable at a high power efficiency. The demodulating apparatus is configured to include: first signal output means for outputting a first output signal having a predetermined phase with respect to that of an input signal, a second signal output means for outputting a second output signal having a predetermined phase with respect to that of the input signal, gate means for gating at least the second output signal, calculation means for adding, or subtracting the first output signal and the second output signal; and control means for controlling the operation of the gate means in response to a logic level of input data.

3 Claims, 23 Drawing Sheets

FIG. 7
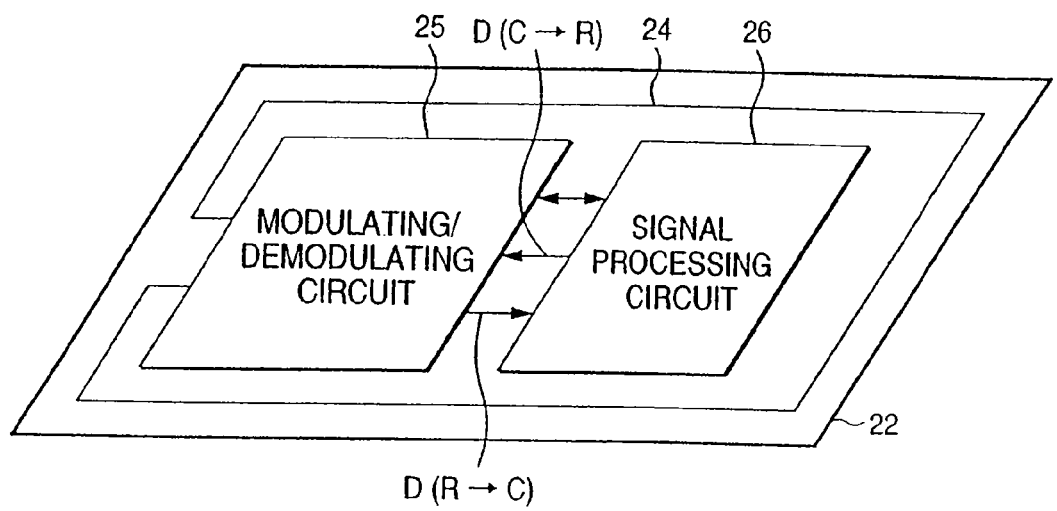
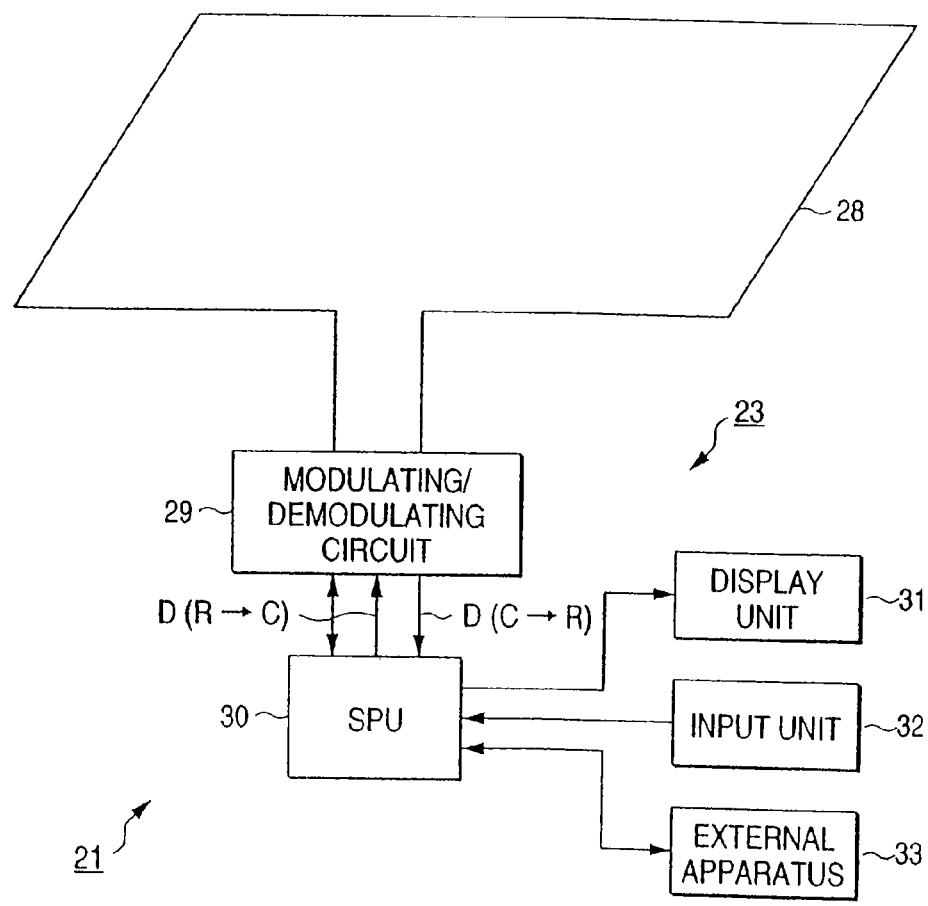

FIG. 10
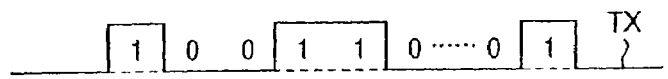
| | | SELECTING CIRCUIT 57 | | |
|---|---|---|---|---|
| | | REVERSE | OFF | NORMAL PHASE |
| SELECTING CIRCUIT 61 | REVERSE | P1 + P2 | P2 | \|P1 - P2\| |
| | OFF | P1 | 0 | P1 |
| | NORMAL PHASE | \|P1 - P2\| | P2 | P1 + P2 |
FIG. 11 (A)
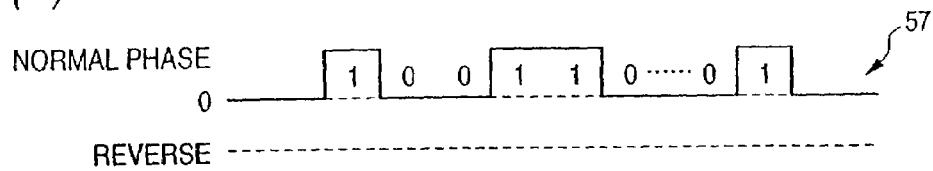
FIG. 11 (B)
FIG. 11 (C)
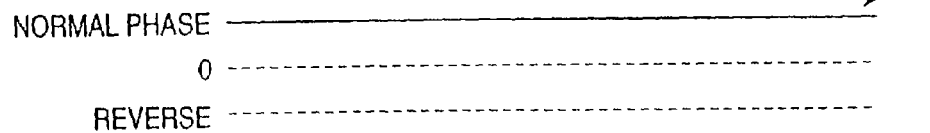
FIG. 11 (D)
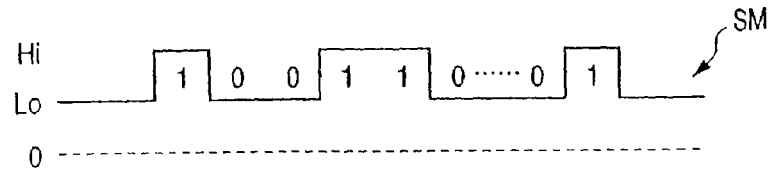

| OEI | IN | Gp | Gn |
|-----|-----|-----|-----|
| L | L | H | H |
| L | H | L | L |
| H | x | H | L |

CONTACTLESS IC CARD SYSTEM

This patent application is a divisional of U.S. application Ser. No. 11/226,562 filed on Sep. 14, 2005, which is a divisional of U.S. application Ser. No. 10/886,745 filed on Jul. 8, 2004 and issued as U.S. Pat. No. 7,016,432 on Mar. 21, 2006, which is a divisional of U.S. application Ser. No. 10/442,736 filed May 21, 2003 and issued as U.S. Pat. No. 6,784,730 on Aug. 31, 2004, which is a divisional of U.S. application Ser. No. 09/751,140 filed Dec. 29, 2000 and issued as U.S. Pat. No. 6,586,988 on Jul. 1, 2003, which is a divisional of U.S. application Ser. No. 09/327,757 filed Jun. 7, 1999 and issued as U.S. Pat. No. 6,198,361 on Mar. 6, 2001, the disclosures of which are herein incorporated be reference.

BACKGROUND OF THE INVENTION

The present invention generally relates to a contactless IC card system. More specifically, the present invention is directed to an amplifying circuit, a modulating circuit, a demodulating circuit, a transmitter apparatus, and a receiver apparatus, applicable to a contactless IC card capable of reading/writing various sorts of data in a contactless manner, and is also applicable to an IC card reader/writer capable of communicating data with this contactless IC card.

Conventionally, in IC card systems which employ IC cards, these IC card systems are applied to ticket inspection systems used in transportation facilities, and person entrance/exit management systems for rooms. Such conventional IC card systems utilize IC cards carried by users and IC card readers/writers capable of transmitting/receiving various sorts of data between the IC cards and the readers/writers. These data may be transmitted/received in the contactless manner between the IC cards and the IC card readers/writers.

In other words, in this sort of IC card system, an IC card reader/writer modulates a carrier wave having a preselected frequency by using a desired data stream so as to produce a transmission signal, and then transmits this produced transmission signal to the IC card.

The IC card receives this transmission signal via an antenna, and then demodulates this transmission signal to decode the data sent from the IC card reader/writer. Furthermore, the IC card modulates internally saved data, such as personal data, by using a preselected carrier wave in response to this received data, and then sends out the modulated data to the IC card reader/writer.

Then, the IC card reader/writer receives the data sent from this IC card. Based upon this received data, a door of a ticket inspection machine is opened/closed. Also, any person is allowed to enter into a room, and/or to come out from this room.

In such a conventional IC card system, these data are modulated by the ASK (Amplitude Shift Keying) modulating method, and then the ASK-modulated data is transmitted/received between the IC card and the card reader/writer. Conventionally, as such a modulating means for an ASK modulation signal, a modulating circuit with using a variable gain amplifying circuit, and a multiplying circuit is employed. Also, as such a demodulating means for the ASK modulation signal, a demodulating circuit with using an envelope detecting circuit constructed of a diode, and using a synchronization detecting circuit is employed.

FIG. 1 is a schematic block diagram for showing one conventional modulating circuit constructed of this variable gain amplifying circuit. In this modulating circuit 1, the gain of the variable gain amplifying circuit 2 is switched in response to a logic level of a data stream D to be sent. Also, a carrier signal SC is amplified by this variable gain amplifying circuit 2. As a result, this modulating circuit 1 modulates the amplitude of the carrier signal SC outputted from the variable gain amplifying circuit 2 in response to the logic level of the data stream D so as to produce an ASK modulation signal SM.

Also, FIG. 2 is a schematic block diagram for indicating another conventional modulating circuit arranged by a balanced modulating circuit with employment of a multiplying circuit. In this modulating circuit 3, the carrier signal SC is multiplied by the data stream D in the multiplying circuit 4, and while the amplitude of this carrier signal SC is varied in response to the logic level of the data stream D, the ASK modulation signal SM is produced.

In contrast, FIG. 3 is a schematic block diagram for showing one conventional demodulating circuit arranged by an envelope detecting circuit with employment of a diode. In this demodulating circuit 6, the ASK modulation signal SM is rectified by employing the diode D. Furthermore, this rectified ASK modulation signal SM is entered into a smoothing circuit having a predetermined time constant defined by a resistor R and a capacitor C. As a result, the envelope-detected output of the ASK modulation signal is outputted as the demodulation signal SD.

FIG. 4 is a schematic block diagram for representing another conventional demodulating circuit arranged by a synchronization detecting circuit. In this demodulating circuit 8, a carrier signal component SCC is extracted from the ASK modulation signal SM by employing a phase-synchronization system circuit 9 arranged by, for example, a filter circuit arrangement and a PLL circuit arrangement. Both this carrier signal component SCC is multiplied by the ASK modulation signal SM by a multiplying circuit 10. In the demodulating circuit 8, a baseband component is extracted from the multiplied result of this multiplying circuit 10 by a low-pass filter (LPF) 12 to thereby be outputted as the demodulation signal SD.

On the other hand, the following demands are made in these conventional IC card systems. That is, these modulating circuits and demodulating circuits can be simply and readily manufactured in the IC form in combination with other circuit blocks. Moreover, these modulating/demodulating circuits can be operated in high efficiencies.

Moreover, these modulating circuits and demodulating circuits with employment of the conventional circuit arrangements can hardly satisfy the necessary items for the IC card systems.

In further detail, in the modulating circuit arranged by the variable gain amplifying circuit, the voltage range which can be effectively utilized by the variable gain amplifying circuit is limited. This voltage range limitation causes the lower power efficiency of the conventional modulating circuit. Also, as to the modulating circuit with employment of the multiplying circuit, there are such drawbacks that the circuit arrangement becomes complex, and this complex modulating circuit cannot be simply and readily manufactured in the IC form.

For instance, also in the power amplifying circuit for the ASK modulation signal, which is similarly required to be manufactured in the IC form similar to such modulating circuits, the ASK modulation signal must be amplified while saving a change contained in the amplitudes of this ASK modulation signal. After all, this power amplifying circuit must be operated in the better linearity region. This causes a power efficiency to be lowered also in the power amplifying circuit. Also, this power amplifying circuit has a drawback in that in order to transmit sufficiently high power, the active elements capable of satisfying the necessary allowable current and the allowable loss must be used instead of commercially available general-purpose electronic components.

In contrast, the demodulating circuit arranged by the envelope detecting circuit with employment of the diode owns such a drawback that a leakage current is produced in the diode when this demodulating circuit is manufactured in the IC form, and therefore, the detection efficiency of the ASK modulation signal is considerably lowered. In other words, as shown in FIG. 5, when an envelope detecting circuit with employment of a diode is manufactured in the IC form, both polarities must be set to floating potentials at the diode D. As a result, a stray transistor is necessarily produced. Accordingly, as represented in FIG. 6, a leakage current is produced.

On the other hand, in the conventional demodulating circuit arranged by the synchronization detecting circuit, there is another drawback in that the circuit arrangement of the phase synchronization system circuit 9 becomes complex.

SUMMARY OF THE INVENTION

The present invention has been made to solve the above-explained drawbacks of the prior art, and therefore, has an object to provide a modulating circuit, a demodulating circuit, an amplifying circuit used in this modulating circuit, and furthermore, a transmitter apparatus as well as a receiver apparatus with employment of these modulating circuit and demodulating circuit, which can be simply and easily manufactured with an IC form in combination with other circuit blocks, and also which can be operated in high efficiencies.

Another object of the present invention is to provide the following modulating circuit, amplifying circuit applicable to this modulating circuit, and also a transmitter apparatus with using this modulating circuit. That is, first and second output signals having predetermined phases with respect to an input signal are added to each other, and the added result is outputted. At least, the second output signal is gated in response to the input data. Also, on the output side of a power amplifying circuit, the power-amplified results are attenuated in accordance with the input data so as to produce an amplitude-modulated signal. This circuit arrangement can be simply and readily manufactured in the IC form together with other circuit blocks.

Also, since amplitude-modulated signals are biased to be amplified, or clamped, a demodulating circuit and a receiver apparatus with using this demodulating circuit can be simply and easily manufactured in the IC form in combination with other circuit blocks.

Furthermore, amplitude-modulated signals are clamped, polarities of these amplitude-modulated signals are judged to multiply the polarity judgment result by the amplitude-modulated signals, and furthermore, the amplitude-modulated signals are selectively outputted based upon the polarity judgment results of the amplitude-modulated signals. As a result, another demodulating circuit and another receiver apparatus with using this demodulating circuit can be simply and readily manufactured in the IC form together with other circuit blocks.

To achieve the above-described objects, a modulating circuit, according to a first aspect of the present invention, includes:

first signal output means for outputting a first output signal having a predetermined phase with respect to that of an input signal;

a second signal output means for outputting a second output signal having a predetermined phase with respect to that of the input signal;

gate means for gating at least the second output signal;

calculation means for adding, or subtracting the first output signal and the second output signal; and control means for controlling the operation of the gate means in response to a logic level of input data.

Also, a modulating circuit as recited in the first aspect, according to a second aspect, is configured so that:

the first signal output means outputs the first output signal having the same phase as that of the input signal; and the second signal output means outputs the second output signal having the phase opposite to that of the input signal.

Another aspect of the above-described modulating circuit as recited in the first aspect, according to a third aspect, is configured so that:

the first signal output means power-amplifies the first output signal to output the power-amplified first output signal; and the second signal output means power-amplifies the second output signal to output the power-amplified second output signal.

A modulating circuit as recited in the first aspect, according to a fourth aspect, includes features wherein:

the input signal is constituted by a sine wave signal having a single frequency.

A modulating circuit as recited in the first aspect, according to a fifth aspect, includes features wherein:

the input signal is constituted by a rectangular wave signal having a single frequency.

A modulating circuit as recited in the fifth aspect, according to a sixth aspect, includes features wherein:

the second signal output means outputs the second output signal having the phase opposite to that of the input signal by inverting the logic level of the input signal.

A modulating circuit as recited in the third aspect, according to a seventh aspect, includes features wherein:

the gate means controls to stop the power amplifying process operation by the second signal output means so as to gate the second output signal; and the second signal output means maintains an impedance of an output terminal at a high impedance for a time period during which the power amplifying process operation is stopped.

A modulating circuit as recited in the third aspect, according to an eighth aspect, includes features wherein:

both the first output signal means and the second output signal means are arranged by a switching circuit for switching operations in response to the input signal.

A modulating circuit as recited in the third aspect, according to a ninth aspect, includes features wherein:

at least the second signal output means and the gate means are tri-state buffer circuits.

A modulating circuit as recited in the first aspect, according to a tenth aspect, includes features wherein:

the first signal output means outputs the first output signal from a first antenna;

the second signal output means outputs the second output signal from a second antenna; and the calculation means is formed by way of an electromagnetic coupling between the first antenna and the second antenna.

Also, to achieve the above-described objects, an amplifying circuit, according to an eleventh aspect of the present invention, includes an amplifying circuit in which an operation of a field-effect transistor is switched in response to an input signal so as to output a power-amplified signal of the input signal from the field-effect transistor, comprising:

a drive circuit for switching the operation of the field-effect transistor by applying a voltage to a gate of the field-effect transistor, the voltage being higher than, or equal to a source-to-drain voltage of the field-effect transistor.

An amplifying circuit as recited in the eleventh aspect, according to a twelfth aspect, includes features wherein:

an output terminal is constituted in such a manner that the output terminal can be set to a high impedance.

Further, to achieve the above-explained objects, an amplifying circuit, according to a thirteenth aspect of the present invention, includes:

first variable resistor means, one end of which is held at a first potential, and the resistance value of which is varied in response to a first control signal;

second variable resistor means, one end of which is connected to the other end of the first variable resistor means, the other end of which is held at a second potential different from the first potential, and the resistance value of which is varied in response to a second control signal; and control means for switching a signal level of the first control signal and a signal level of the second control signal so as to switch a potential at a connection center point between the first variable resistor means and the second variable resistor means to another potential corresponding to the first and second potentials, and also so as to switch an impedance of the connection center point to a high impedance in response to both an input signal and a control signal.

An amplifying circuit as recited in the thirteenth aspect according to a fourteenth aspect, includes features wherein:

the first variable resistor means and the second variable resistor means are field-effect transistors.

An amplifying circuit as recited in the fourteenth aspect according to a fifteenth aspect, includes features wherein:

the control means switches the signal level of the control signal and the signal level of the second control signal to a voltage higher than, or equal to a source-to-drain voltage of the field-effect transistor.

To achieve these objects, a transmitter apparatus, according to a sixteenth aspect of the present invention, includes a transmitter apparatus for amplitude-modulating input data by using a modulating circuit to thereby transmit the amplitude-modulated input data, wherein:

the modulating circuit is comprised of:

first signal output means for outputting a first output signal having a predetermined phase with respect to that of an input signal;

a second signal output means for outputting a second output signal having a predetermined phase with respect to that of the input signal;

gate means for gating at least the second output signal;

calculation means for adding, or subtracting the first output signal and the second output signal; and control means for controlling the operation of the gate means in response to a logic level of input data.

A transmitter apparatus as recited in the sixteenth aspect, according to a seventeenth aspect, includes features wherein:

the first signal output means outputs the first output signal from a first antenna;

the second signal output means outputs the second output signal from a second antenna; and the calculation means is formed by way of an electromagnetic coupling between the first antenna and the second antenna.

Also, to achieve the objects, a transmitter apparatus according to an eighteenth aspect of the present invention, includes a transmitter apparatus for amplitude-modulating input data to thereby transmit the amplitude-modulated input data, which:

a first modulating circuit for producing a first amplitude-modulated signal in response to the input data; and a second modulating circuit for producing a second amplitude-modulated signal made of a carrier wave having a phase opposite to that of the first amplitude-modulated signal; wherein:

each of the first modulating circuit and the second modulating circuit is comprised of:

first signal output means for outputting a first output signal having a predetermined phase with respect to that of an input signal;

a second signal output means for outputting a second output signal having a predetermined phase with respect to that of the input signal;

gate means for gating at least the second output signal;

calculation means for adding, or subtracting the first output signal and the second output signal; and control means for controlling the operation of the gate means in response to a logic level of input data.

To achieve these objects, a modulating circuit, according to a nineteenth aspect of the present invention, includes:

a variable attenuator provided at an output terminal of a power amplifying circuit, for attenuating a power-amplified result of the power amplifying circuit in response to an input signal.

A modulating circuit as recited in the nineteenth aspect, according to a twentieth aspect, includes features wherein:

the signal amplified by the power amplifying circuit is constituted by a sine wave signal having a single frequency.

A modulating circuit as recited in the nineteenth aspect, according to a twenty-first aspect, includes features wherein:

the signal amplified by the power amplifying circuit is constituted by a rectangular wave signal having a single frequency.

Further, to achieve the above objects, a transmitter apparatus, according to a twenty-second aspect of the present invention, is featured by such a transmitter apparatus comprising a modulating circuit by way of an amplitude modulation, wherein:

the modulating circuit is includes:

a variable attenuator provided at an output terminal of a power amplifying circuit, for attenuating a power-amplified result of the power amplifying circuit in response to an input signal.

Also, to achieve these objects, a transmitter apparatus, according to a twenty-third aspect of the present invention, is featured by such a transmitter apparatus for amplitude-modulating an input signal to thereby transmit the amplitude-modulated input signal, includes:

a first modulating circuit for producing a first amplitude-modulated signal in response to the input signal; and a second modulating circuit for producing a second amplitude-modulated signal made of a carrier wave having a phase opposite to that of the first amplitude-modulated signal in response to the input signal; wherein:

each of the first modulating circuit and the second modulating circuit includes:

a variable attenuator provided at an output terminal of a power amplifying circuit, for attenuating a power-amplified result of the power amplifying circuit in response to an input signal.

Also, to achieve the objects, a demodulating circuit, according to a twenty-fourth aspect of the present invention includes:

amplifying means for amplifying an input signal;

bias means for biasing the input signal; and band limiting means for removing a component of the input signal from the output signal derived from the amplifying means.

A demodulating circuit as recited in the twenty-fourth aspect, according to a twenty-fifth aspect, includes features wherein:

the amplifying means corresponds to any one of an amplifying circuit with employment of a transistor, another amplifying circuit with employment of a field-effect transistor, and a differential amplifier circuit.

A demodulating circuit as recited in the twenty-fourth aspect, according to a twenty-sixth aspect, is featured by that:

the band limiting means corresponds to any one of a low-pass filter, a band-pass filter, and a trap filter.

also, to achieve the objects, a receiver apparatus, according to a twenty-seventh aspect of the present invention, is featured by such a receiver apparatus for demodulating sequentially-entered amplitude-modulated signals by using a demodulating circuit, wherein:

the demodulating circuit is comprised of:

amplifying means for amplifying the amplitude-modulated signal;

bias means for biasing the amplitude-modulated signal; and band limiting means for removing a component of the amplitude-modulating signal from the output signal derived from the amplifying means.

Also, to achieve these objects, a demodulating circuit, according to a twenty-eighth aspect of the present invention, is featured includes:

a limiter for limiting an amplitude of an input signal; and band limiting means for removing a component of the input signal from the output signal derived from the limiter.

A demodulating circuit as recited in the twenty-eighth aspect, according to a twenty-ninth aspect, includes features wherein:

the limiter is constituted by a series circuit formed by connecting a diode in series to a constant voltage power source.

A demodulating circuit as recited in the twenty-eighth aspect, according to a thirtieth aspect, includes features wherein:

the band limiting means corresponds to any one of a low-pass filter, a band-pass filter, and a trap filter.

Also, to achieve the objects, a receiver apparatus, according to a thirty-first aspect of the present invention, includes features for demodulating sequentially-entered amplitude-modulated signals by using a demodulating circuit, wherein:

the demodulating circuit includes:

a limiter for limiting the amplitude of the amplitude-modulated signal; and band limiting means for removing a component of the amplitude-modulated signal from the output signal of the limiter.

Further, a demodulating circuit, according to a thirty-second aspect of the present invention, includes:

clamping means for clamping an input signal; and band limiting means for removing a component of the input signal from the output signal of the clamping means.

A demodulating circuit as recited in the thirty-second aspect, according to a thirty-third aspect, includes features wherein:

the clamping means is constituted by a grounded type diode.

A demodulating circuit as recited in the thirty-second aspect, according to a thirty-fourth aspect, includes features wherein:

the band limiting means corresponds to any one of a low-pass filter, a band-pass filter, and a trap filter.

Also, to achieve the objects, a receiver apparatus, according to a thirty-fifth aspect of the present invention, includes features for demodulating sequentially-entered amplitude-modulated signals by using a demodulating circuit, wherein:

the demodulating circuit includes:

clamping means for clamping the amplitude-modulated signal; and band limiting means for removing a component of the amplitude-modulated signal from the output signal of the clamping means.

Also, to achieve the object, a demodulating circuit, according to a thirty-sixth aspect of the present invention, is featured by such a demodulating circuit comprising:

signal processing means for producing first and second input signals having phases different from a phase of an input signal by approximately 180 degrees;

first clamping circuit for clamping the first input signal;

second clamping circuit for clamping the second input signal;

first band limiting means for removing a component of the first input signal from the output signal of the first clamping circuit;

second band limiting means for removing a component of the second input signal from the output signal of the first clamping means; and calculating means for adding, or averaging the output signal of the first band limiting means and the output signal of the second band limiting means.

A demodulating circuit as recited in the thirty-sixth aspect, according to a thirty-seventh aspect, includes features wherein:

the first and second clamping means are constituted by a grounded type diode.

A demodulating circuit as recited in the thirty-sixth aspect, according to a thirty-eighth aspect, is featured by that:

the band limiting means corresponds to any one of a low-pass filter, a band-pass filter, and a trap filter.

To achieve the objects, a receiver apparatus, according to a thirty-ninth aspect of the present invention, features a receiver apparatus for demodulating sequentially-entered amplitude-modulated signals by using a demodulating circuit, wherein:

the demodulating circuit includes:

signal processing means for producing first and second amplitude-modulated signals having phases different from a phase of the amplitude-modulated signal by approximately 180 degrees;

first clamping circuit for clamping the first amplitude-modulated signal;

second clamping circuit for clamping the second amplitude-modulated signal;

first band limiting means for removing a component of the first amplitude-modulated signal from the output signal of the first clamping circuit;

second band limiting means for removing a component of the second amplitude-modulated signal from the output signal of the first clamping means; and calculating means for adding, or averaging the output signal of the first band limiting means and the output signal of the second band limiting means.

Further, to achieve the objects, a demodulating circuit, according to a fortieth aspect of the present invention, includes:

signal processing means for producing first and second input signals having phases different from a phase of an input signal by approximately 180 degrees;

first clamping circuit for clamping the first input signal;

second clamping circuit for clamping the second input signal;

calculating means for adding, or averaging the output signal of the first band limiting means and the output signal of the second band limiting means; and band limiting means for removing a component of the input signal from the output signal of the calculating means.

A demodulating circuit as recited in the fortieth aspect, according to a forty-first aspect, includes features wherein:

the first and second clamping means are constituted by a grounded type diode.

A demodulating circuit as recited in the fortieth aspect, according to a forty-second aspect, includes features wherein:

the band limiting means corresponds to any one of a low-pass filter, a band-pass filter, and a trap filter.

To achieve the objects, a receiver apparatus, according to a 43rd aspect of the present invention, includes features for demodulating sequentially entered amplitude-modulated signals by using a demodulating circuit, wherein:

the demodulating circuit includes:

signal processing means for producing first and second amplitude-modulated signals having phases different from a phase of the amplitude-modulated signal by approximately 180 degrees;

first clamping circuit for clamping the first amplitude-modulated signal;

second clamping circuit for clamping the second amplitude-modulated signal;

calculating means for adding, or averaging the output signal of the first band limiting means and the output signal of the second band limiting means; and band limiting means for removing a component of the amplitude-modulated signal from the output signal of the calculating means.

To achieve the objects, a demodulating apparatus, according to a forty-fourth aspect of the present invention, a demodulating apparatus including:

polarity judging means for judging a polarity of an amplitude-modulated signal to thereby output a polarity judgment result;

multiplying means for multiplying the polarity judgment result by the amplitude-modulated signal to thereby output a multiplication result; and band limiting means for removing a component of the amplitude-modulated signal from the multiplication result.

A demodulating circuit as recited in the forty-fourth aspect, according to a forty-fifth aspect, includes features wherein:

the polarity judging means is constituted by a limiter for limiting the amplitude of the amplitude-modulated signal on a positive side and on a negative side.

A demodulating circuit as recited in the forty-fourth aspect, according to a forty-sixth aspect, includes features wherein:

the multiplying means is constructed of a double balanced mixer.

A demodulating circuit as recited in the forty-fourth aspect, according to a forty-seventh aspect, is featured by that:

the band limiting means corresponds to any one of a low-pass filter, a band-pass filter, and a trap filter.

Furthermore, to achieve the objects, a receiver apparatus, according to a forty-eighth aspect of the present invention, is featured by such a receiver apparatus for demodulating sequentially-entered amplitude-modulated signals by using a demodulating circuit, wherein:

the demodulating circuit includes:

polarity judging means for judging a polarity of an amplitude-modulated signal to thereby output a polarity judgment result;

multiplying means for multiplying the polarity judgment result by the amplitude-modulated signal to thereby output a multiplication result; and band limiting means for removing a component of the amplitude-modulated signal from the multiplication result.

Moreover, to achieve the objects, a demodulating circuit, according to a forty-ninth aspect of the present invention, includes:

signal producing means for producing first and second amplitude-modulated signals having phases inverted from each other from an amplitude-modulated signal;

polarity judging means for judging a polarity of one of the amplitude-modulated signal, the first amplitude-modulated signal, and the second amplitude-modulated signal to thereby output a polarity judgment result;

selecting/outputting means for selectively outputting the first amplitude-modulated signal and the second amplitude-modulated signal based upon the polarity judgment result; and band limiting means for removing a component of the amplitude-modulated signal from the output signal of the selecting/outputting means.

A demodulating circuit as recited in the forty-ninth aspect, according to a fiftieth aspect, includes features wherein:

the band limiting means corresponds to any one of a low-pass filter, a band-pass filter, and a trap filter.

Also, to achieve the objects, a receiver apparatus, according to a fifty-first aspect of the present invention, includes a receiver apparatus for demodulating sequentially-entered amplitude-modulated signals by using a demodulating circuit, wherein:

the demodulating circuit is comprised of:

signal producing means for producing first and second amplitude-modulated signals having phases inverted from each other from an amplitude-modulated signal;

polarity judging means for judging a polarity of one of the amplitude-modulated signal, the first amplitude-modulated signal, and the second amplitude-modulated signal to thereby output a polarity judgment result;

selecting/outputting means for selectively outputting the first amplitude-modulated signal and the second amplitude-modulated signal based upon the polarity judgment result; and band limiting means for removing a component of the amplitude-modulated signal from the output signal of the selecting/outputting means.

BRIEF DESCRIPTION OF THE DRAWINGS

For a better understanding of the present invention, reference is made of a detailed description to be read in conjunction with the accompanying drawings, in which:

FIG. 7 is a schematic block diagram for representing an overall arrangement of an IC card system according to a first embodiment of the present invention;

FIG. 10 is a table for explaining operation of the modulating circuit shown in FIG. 9.

FIGS. 11(A)–11(D) are time charts for describing the operation of the modulating circuit indicated in FIG. 9;

DETAILED DESCRIPTION OF THE PREFERRED EMBODIMENTS

Figure 1:
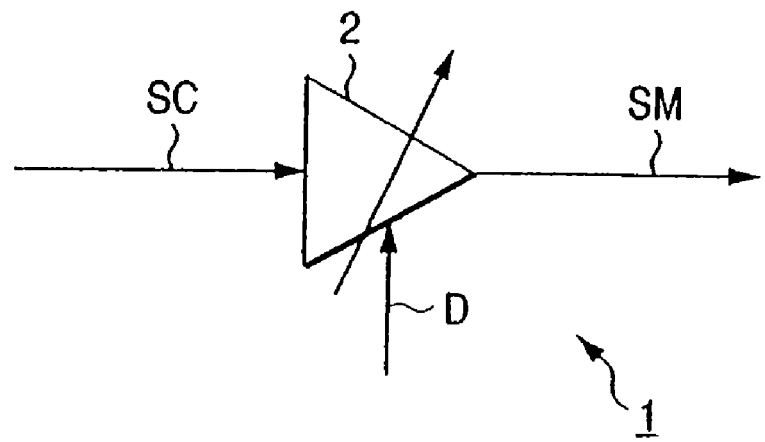
FIG. 1 is a schematic block diagram for showing a conventional modulating circuit with using a variable gain amplifying circuit.
Figure 2:
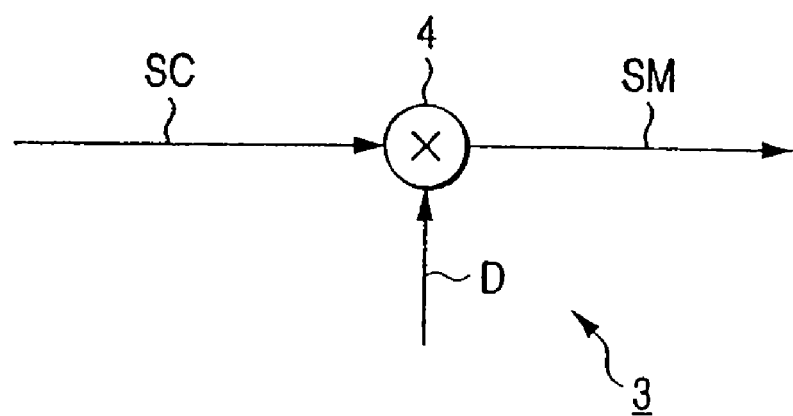
FIG. 2 is a schematic block diagram for indicating another conventional modulating circuit with using a multiplying circuit.
Figure 3:
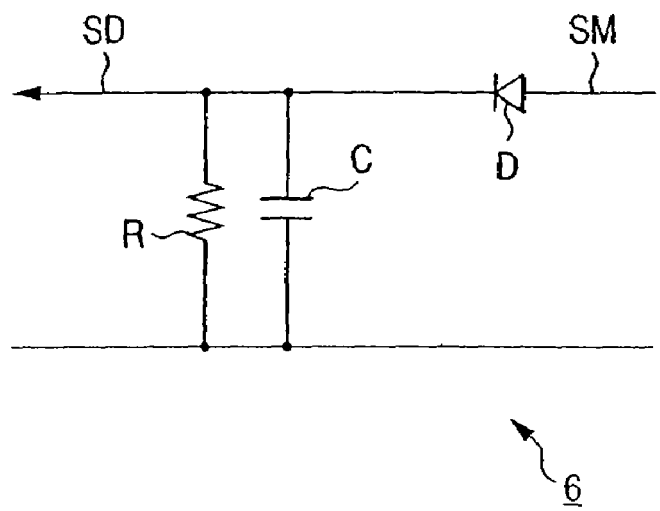
FIG. 3 is a schematic block diagram for representing a conventional demodulating circuit with employment of a diode by way of an envelope detection.
Figure 4:
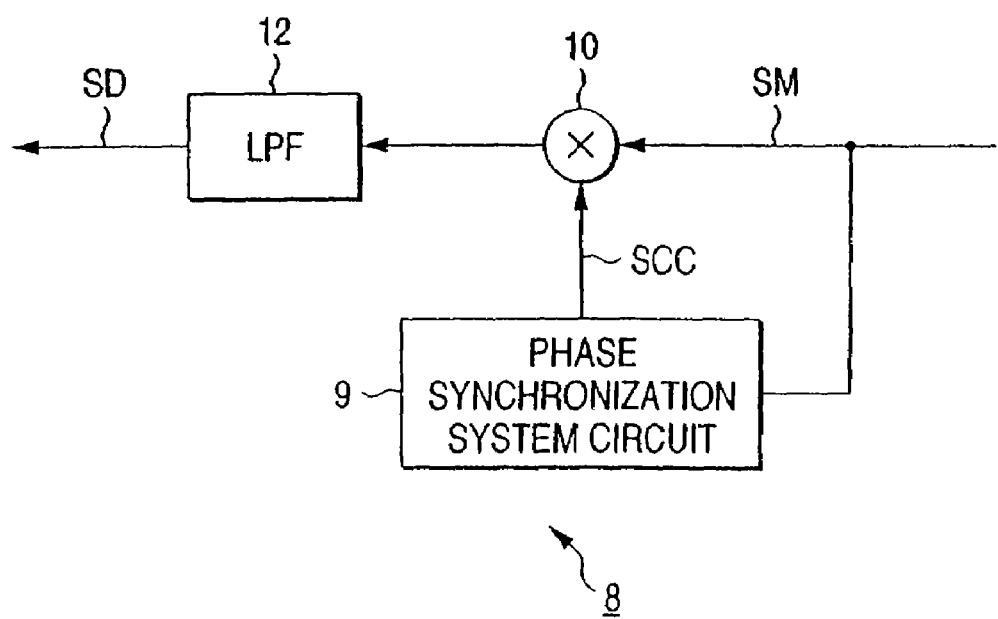
FIG. 4 is a schematic block diagram for indicating another conventional demodulating circuit by way of a phase synchronization detection.
Figure 5:
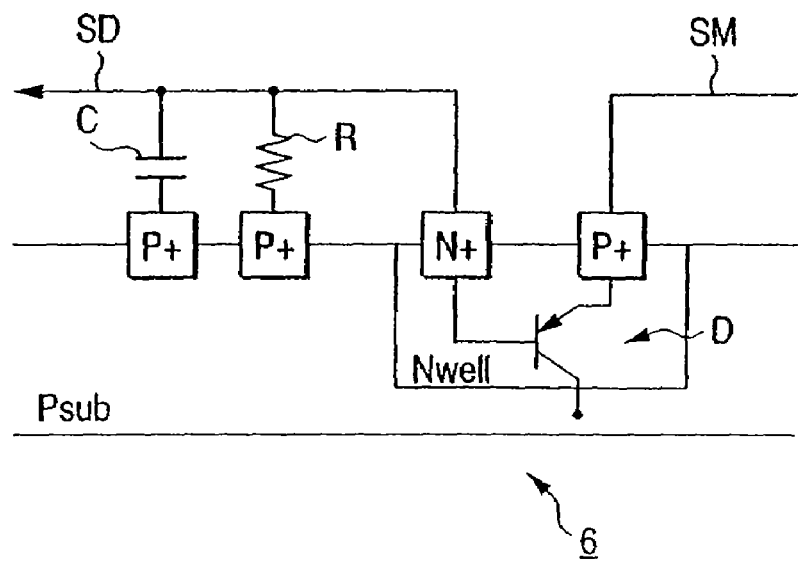
FIG. 5 schematically shows an integrated circuit arrangement of the conventional demodulating circuit shown in FIG. 3.
Figure 6:
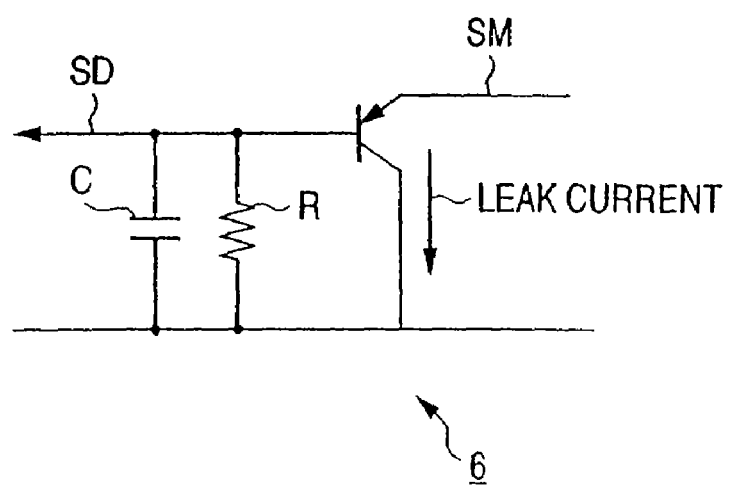
FIG. 6 is a connection diagram for schematically indicating an equivalent circuit of the integrated demodulating circuit shown in FIG. 5.

Referring now to drawings, various preferred embodiments of the present invention will be described.

Circuit Arrangement of First Embodiment

FIG. 7 is a schematic block diagram for showing an IC (Integrated Circuit) card system 21 according to a first embodiment of the present invention. This first IC card system 21 is applied to, for example, a ticket inspection system of transportation facilities. In this IC card system 21, data is communicated between an IC card 22 and an IC card reader/writer 23.

In this case, the IC card 22 is formed in a card shape in such a manner that a (circuit) board on which an integrated circuit is mounted is stacked with a protection sheet. In this IC card 22, a loop antenna 24 is formed by a wiring pattern formed on this board. Also, a modulating/demodulating circuit 25 and a signal processing circuit 26 are constituted by the integrated circuit mounted on this board.

In this embodiment, the loop antenna 24 is coupled to another loop antenna 28 of the IC card reader/writer 23 so as to receive a transmission signal transmitted from this loop antenna 28, and also to radiate a response (acknowledge) signal produced by the modulating/demodulating circuit 25.

The modulating/demodulating circuit 25 produces electric power, a clock signal, and the like, which are required for the operations of this IC card 22 by using the transmit signal received by the loop antenna 24. Furthermore, the modulating/demodulating circuit 25 is operated by using this electric power and the clock signal to demodulate a data stream "D(R→C)" transmitted from the reader/writer 23 (will be referred to as a "transmit data stream" hereinafter), and then outputs the demodulated data stream to the signal processing circuit 26. In response to another data stream "D(C→R)" entered from the signal processing circuit 26 and requested by the transmit data stream "D(R→C)", this modulating/demodulating circuit 25 produces a response signal based upon an ASK modulation signal. In response of this response signal, the modulating/demodulating circuit 25 drives the loop antenna 24 so as to radiate a response signal. This response data stream will be referred to as a "response data stream D(C→R)" hereinafter.

The signal processing circuit 26 is operated by the electric power and the clock generated from the modulating/demodulating circuit 25 so as to analyze the transmit data stream D(R→C), and to output the response data stream D(C→R) saved in a non-volatile memory build in this IC card to the modulating/demodulating circuit 25, if required.

In the reader/writer 23, the modulating/demodulating circuit 29 produces a transmit signal by the ASK modulation signal based upon a transmit data stream D(R→C) entered from an SPU (signal process unit) 30, and drives the loop antenna 28 by this transmit signal. Also, the modulating/demodulating circuit 29 performs a signal process operation of the response signal received by this loop antenna 28 so as to demodulate the response data stream "D(C→R)" transmitted from the IC card 22, and then outputs this demodulated response data stream D(C→R) to the SPU 30.

The SPU 30 is arranged by a calculation processing unit for executing a relatively simple process sequence. This SPU 30 sends out the transmit data stream "D(R→C)" to the modulating/demodulating circuit 29, and also processes the response data stream "D(C→R)" entered from this modulating/demodulating circuit 29. This transmit data stream D(R→C) is to be transmitted to the IC card 22. In this process operation, the SPU 30 causes a display unit 31 to display thereon a process history and a process result, if required. In response to a command supplied from an input unit 32, the operations of the SPU 30 are switched so as to input/output data about the process sequence in/from an external apparatus 33 or the like, if necessary.

Figure 8:
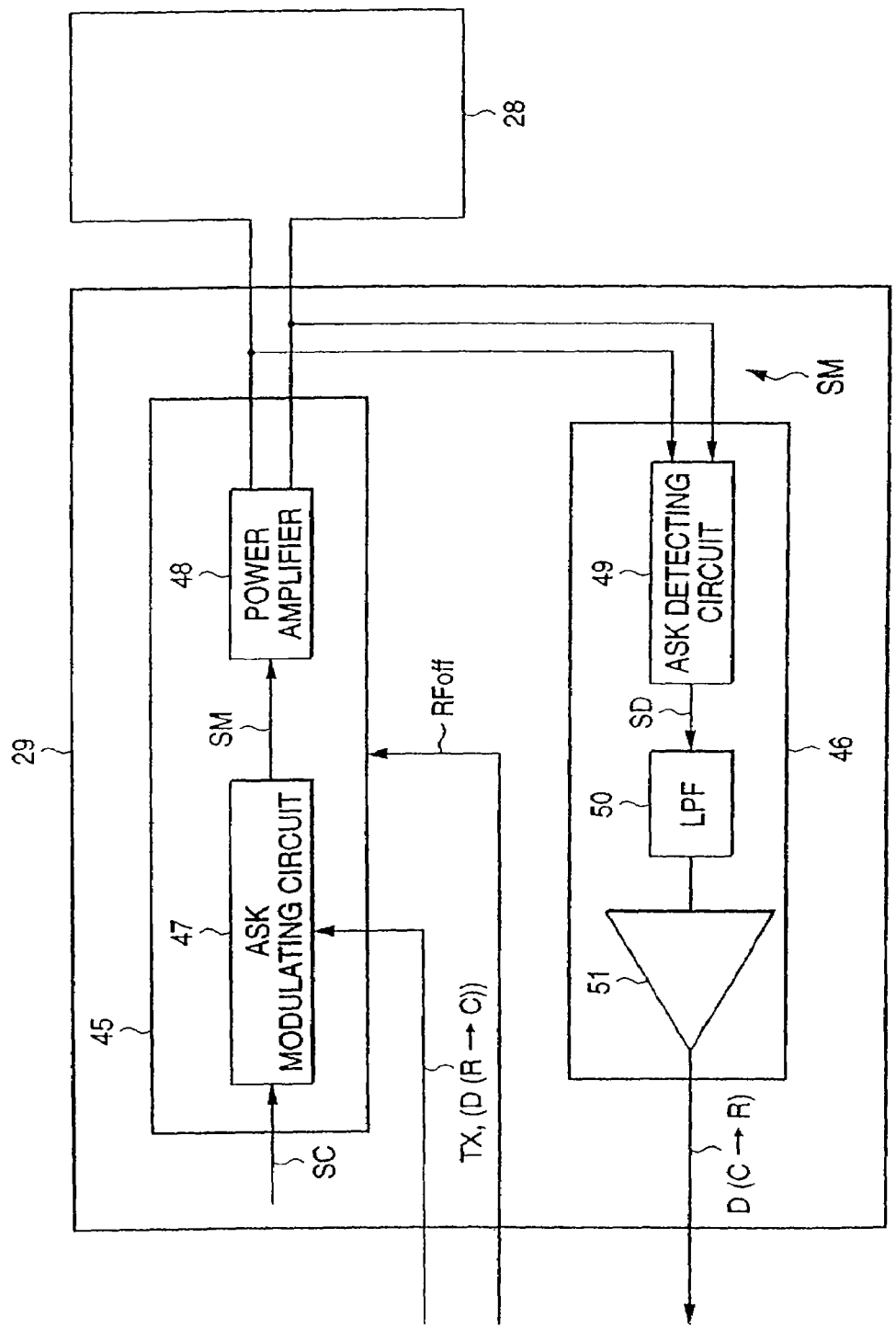
FIG. 8 is a schematic block diagram for showing a modulating/demodulating circuit of the IC card system according to the first embodiment.

FIG. 8 is a schematic block diagram for partially indicating a circuit structure of the modulating/demodulating circuit 29 employed in the reader/writer 23. As shown in this drawing, the modulating/demodulating circuit 29 is arranged by a transmission-sided block 45 and a reception-sided block 46.

In this embodiment, the transmission-sided block 45 modulates the transmit data stream "D(R→C)" outputted from the SPU 30 in response to a control signal "RFoff" outputted from the SPU 30 to thereby send out the modulated transmit data stream D(R→C) from the loop antenna 28. As a result, the transmission-sided block 45 produces a carrier signal SC having a frequency of 13.56 [MHz] by operating an oscillator circuit built in this transmission-sided block 45. Also, this transmission-sided block 45 decodes the transmit data stream "D(C→R)" so as to be converted into a transmit data stream by the Manchester code.

In an ASK modulating circuit 47 of the transmission-sided block 45, the carrier signal SC is ASK-modulated by using the transmit data stream "TX(D(R→C))" which is coded in this manner to thereby produce an ASK modulation signal "ISM". Furthermore, this ASK modulation signal "SM" is amplified by a power amplifying circuit 48 to thereby drive the loop antenna 28 by this amplified ASK modulation signal "SM".

The reception-sided block 46 processes the response signal SM obtained via the loop antenna 28 so as to demodulate the response data stream "D(C→R)". In other words, the reception-sided block 46 detects the response signal SM obtained via the loop antenna 28 so as to produce a detecting signal "SD" in the ASK (Amplitude Shift Keying) detecting circuit 49. The signal level of this detection signal SD is changed in response to the logic level of the response data stream "D(C→R)". The reception-sided block 46 limits the pass band of this detection signal SD by a low-pass filter (LPF) 50 subsequent to the ASK detecting circuit 49, and thereafter, amplifies the filtered detection signal by a predetermined gain using an amplifying circuit 51 and furthermore, digitalizes the amplified detection signal. Furthermore, the reception-sided block 46 decodes this binary-coded data, and thus, reproduces and outputs the response data stream "D(C→R)" based on this binary-coded data.

Basic Circuit Arrangement of Transmitting Circuit

Figure 9:
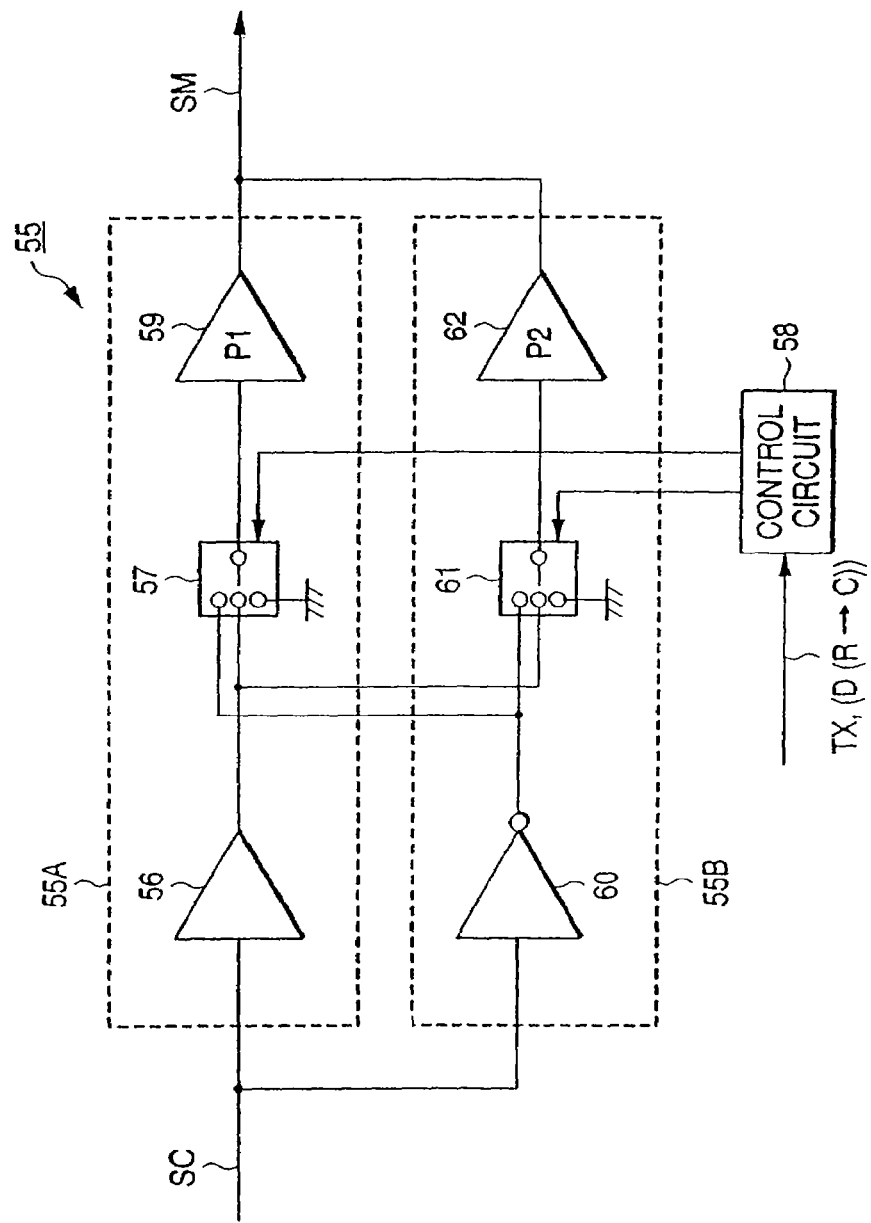
FIG. 9 is a schematic block diagram for indicating a basic structure of a modulating circuit applied to an IC card reader/writer according to a first embodiment of the present invention.

FIG. 9 is a schematic block diagram for showing a basic circuit arrangement of the above-described ASK modulating circuit 47 and power amplifying circuit 48 (will be referred to as a "transmitting circuit" 55 hereinafter). This transmitting circuit 55 contains two signal paths (systems) of processing circuits 55A and 55B, which each have a power amplifying circuit.

In this case, the first processing unit 55A receives the carrier signal SC via a buffer amplifying circuit 56, and then enters the output signal of the buffer amplifying circuit 56 into a second selection input terminal of a selecting circuit 57. This output signal from the buffer amplifying circuit 56 has the same phase as that of the carrier signal SC. In this case, this selecting circuit 57 enters a signal having a phase opposite to that of the carrier signal SC into a first selection input terminal, and grounds the remaining third selection input terminal. This signal having the opposite phase is derived from the second processing circuit 55B. The selecting circuit 57 switches contacts under control of a control circuit 58, and a power amplifying circuit 59 provided subsequent to this selecting circuit 57 amplifies the output signal derived from the selecting circuit 57.

As a result, the first processing circuit 55A is arranged in such a manner that the selecting circuit 57 switches the first contact and the second contact, so that the signal having the phase opposite to that of the carrier signal SC can be gated. Similarly, this first processing circuit 55A is so arranged that the selecting circuit 57 switches the second contact and the third contact, so that the signal having the same phase as that of the carrier signal SC can be gated.

In contrast, the second processing circuit 55B enters the carrier signal SC into a buffer amplifying circuit 60 having the same amplification factor as that of the buffer amplifying circuit 56, which is arranged by an inverting amplifying circuit. As a result, the second processing circuit 55B produces a signal having a phase opposite to that of the buffer amplifying circuit 60, and inputs this signal having the opposite phase into a first selecting input terminal of a selecting circuit 61. In this case, this selecting circuit 61 enters a signal having a phase opposite to that of the carrier signal SC into a second selection input terminal, and grounds the remaining third selection input terminal. This signal having the opposite phase is derived from the first processing circuit 55A. The selecting circuit 61 switches contacts under control of the control circuit 58, and a power amplifying circuit 62 provided subsequent to this selecting circuit 61 amplifies the output signal derived from the selecting circuit 61.

As a result, the second processing circuit 55B is similarly arranged in such a manner that the selecting circuit 61 switches the first contact and the third contact, so that the signal having the phase opposite to that of the carrier signal SC can be gated. Similarly, this second processing circuit 55B is so arranged that the selecting circuit 61 switches the second contact and the third contact, so that the signal having the same phase as that of the carrier signal SC can be gated.

The transmitting circuit 55 outputs the output-signals derived from the first and second processing circuits 55A and 55B by connecting these processing circuits to the antenna by way of a wiring line. As a result, as indicated in FIG. 10, the transmitting circuit 55 is arranged as follows. Assuming now that the power outputs of the power amplifying circuits 59 and 62 are set to "P1" and "P2", when the contacts of either the selecting circuit 61 or the selecting circuit 57 are switched under such a condition that the contacts of either the selecting circuit 57 or the selecting circuit 61 are positioned on the ground side (namely, condition indicated by "OFF" in FIG. 10), transmit outputs by the power outputs P1 and P2 can be obtained by the in-phase and the reverse phase.

Also, the transmitting circuit is so arranged as follows. When the remaining contacts of either the selecting circuit 61 or the selecting circuit 57 are switched to thereby gate the input signal of either the power amplifying circuit 62 or the power amplifying circuit 59 under such a condition that the contacts of either the selecting circuit 57 or the selecting circuit 61 are set to either the in-phase side or the opposite side, the power amplified results of the power amplifying circuits 59 and 62 are added to each other. Therefore, the transmit outputs outputted from the antenna can be switched. Accordingly, the transmitting circuit 55 can obtain the power-amplified ASK modulation signals SM from the output-terminals of the power amplifying circuits 59 and 62.

The control circuit 58 switches the contacts of the selecting circuits 57 and 61 in response to the transmit data stream TX, so that the ASK modulation signal SM is produced from this transmit data stream TX. In other words, as shown in FIG. 11, under such a condition that the power output from the buffer amplifying circuit 56 is continuously selected on the side of the selecting circuit 61 (see FIG. 11(C)), the control circuit 58 switches the contacts of the selecting circuit 57 in response to the logic level of the transmit data stream TX so as to gate the input signal (see FIG. 11(A) and FIG. 11(B)). As a result, the power-amplified ASK modulation signal SM is produced (see FIG. 11(D)). It should be noted that although FIG. 11 represents such a case that the contacts of the selecting circuit 57 are switched between the output of the buffer amplifying circuit 56 and the ground, the ASK modulation signal may be similarly produced by switching-the contacts between other combinations. Also, even when the selecting operations of the selecting circuits 57 and 61 are switched, or even when the contacts of the selecting circuits 57 and 61 are switched at the same time, the ASK modulation signal may be similarly produced.

Figure 12:
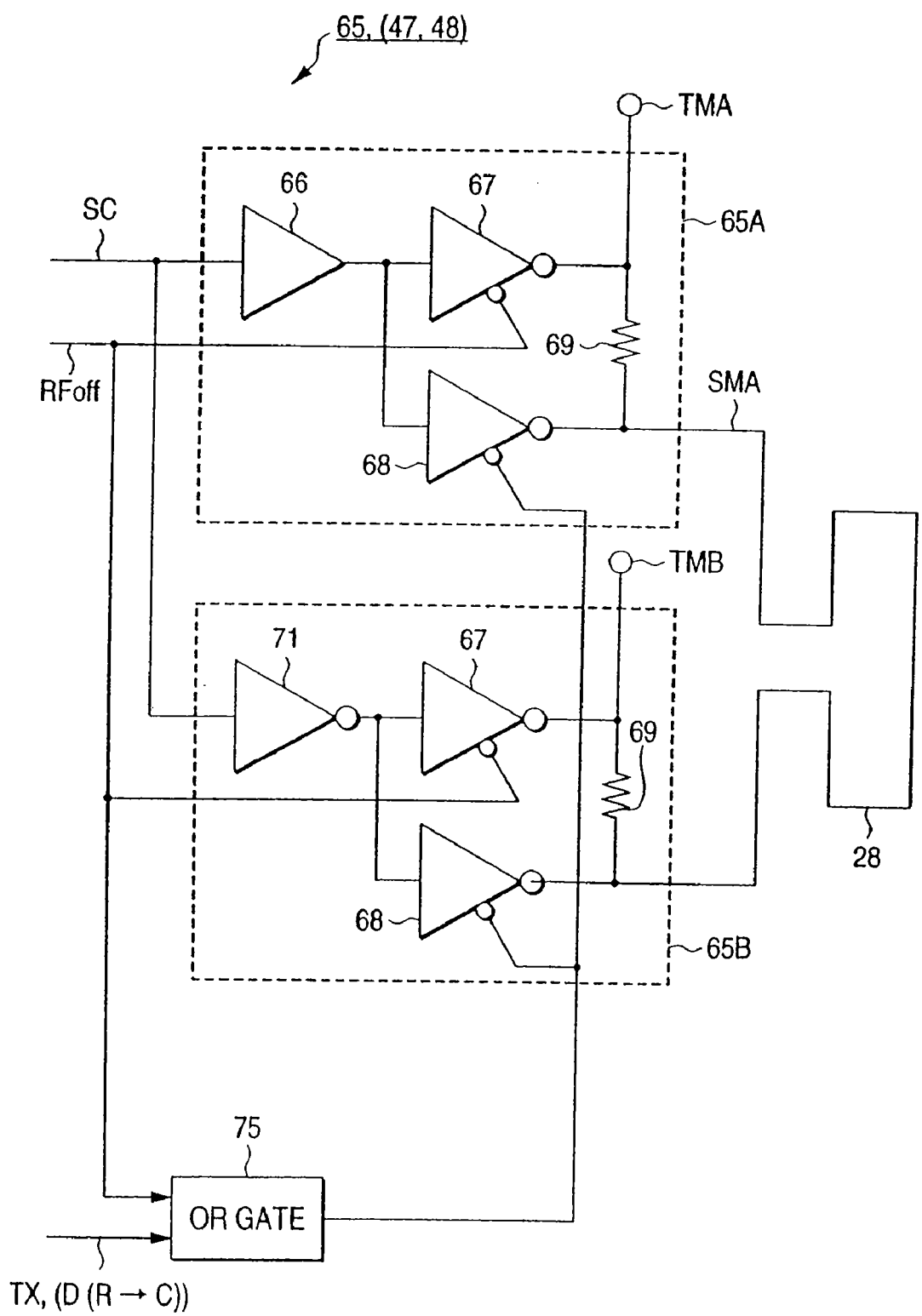
FIG. 12 is a schematic block diagram for indicating a concrete circuit arrangement of the modulating circuit shown in FIG. 9.

Concrete Circuit Arrangements of Ask Modulating Circuit/ Power Amplifying Circuit FIG. 12 is a schematic block diagram for showing concrete circuit arrangements of the ASK modulating circuit 47 and the power amplifying circuit 48 according to the first embodiment. This transmitting circuit 65 contains two signal paths of a transmitting circuit 65A and another transmitting circuit 65B, which may drive both terminals of the loop antenna 28. The above-described two signal paths of processing circuits 55A and 55B are equivalently arranged in the respective transmitting circuits 65A and 65B.

That is, the transmitting circuit 65A enters thereinto the carried signal SC having the in-phase via the buffer amplifying circuit 66, and then this carrier signal SC is entered into a power amplifying circuit 67 and another power amplifying circuit 68. In this case, as represented in FIG. 13, the power amplifying circuit 67, or 68 is constituted by a P-channel MOS field-effect transistor T1, an N-channel MOS field-effect transistor T2, and a control logic 70.

Among these circuit elements, the P-channel MOS field-effect transistor T1 is series-connected to the N-channel MOS field-effect transistor T2, and this series-connected transistors are arranged between the power supply and the ground, and also constitute a switching circuit for switching a potential at an output terminal arranged by a joint point in response to a gate voltage set by the control logic 70.

Figures 13, 14:
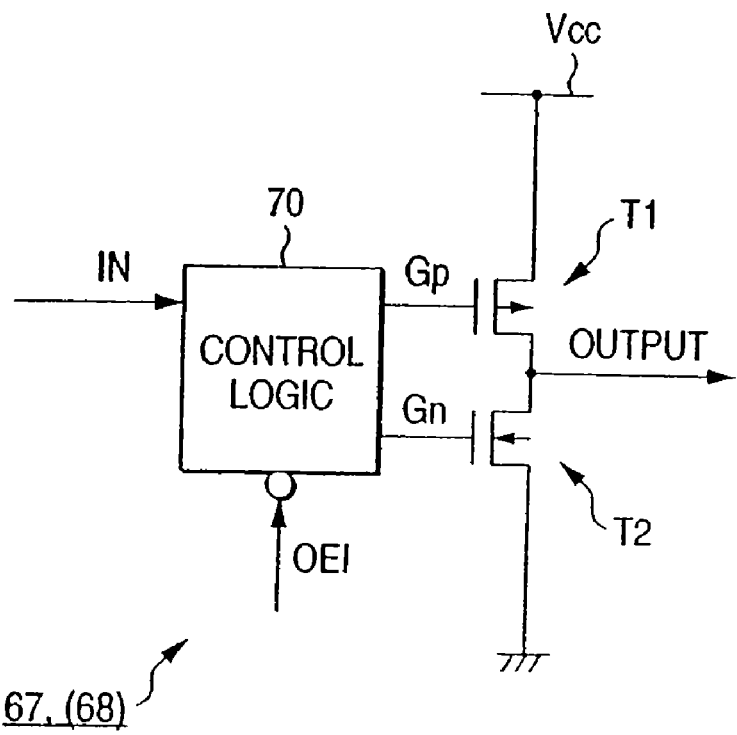
FIG. 13 is a connection diagram for representing a power amplifying circuit shown in FIG. 12.
FIG. 14 is a table for explaining operation of a control logic of the power amplifying circuit shown in FIG. 12.

As indicated in a truth table of FIG. 14, when a control terminal input "OEI" of the control logic 70 is set to as H (high) level, this control logic 70 sets the gate terminals of the respective field-effect transistors T1 and T2 to an H level and an L(low) level. In this case, the control logic 70 sets the logic levels of the gate terminals by varying the voltages at the gate terminals, higher than the drain-to-source voltage of each of the field-effect transistors T1 and T2. As a consequence, the control logic 70 stops the power amplifying process operation, and further holds the output terminal at the high impedance.

Also, when the control logic 70 sets the control terminal input OEI to an L level, this control logic 70 switches the gate terminals of the field-effect transistors T1 and T2 in response to a logic level appearing at the input terminal "in" thereof. As a result, the control logic 70 controls to stop the processing operation of the power amplification in response to the logic level of the input terminal "in", so that the output signal of the power amplifying circuit can be gated in response to the logic level of the input terminal "in".

The power amplifying circuit 67 can stop the power amplifying process operation by switching a control signal "RFoff", if required, while this control signal RFoff is entered to the control terminal input OEI of this control logic 70. Since the power amplifying process operation can be stopped, the resultant power consumption can be reduced.

While the logical OR output of the control signal "RFoff" obtained via an OR gate 75 and the transmit data stream TX are entered into the control terminal input OEI of the control logic 70, the power amplifying circuit 68 can stop the power amplifying operation in conjunction with the above-described power amplifying circuit 67. Also, while the power amplifying circuit 67 executes the power amplifying process operation, the power amplifying circuit 68 stops the power amplifying process operation in response to the logic level of the transmit data stream TX, and also gates the power amplified output having the same phase as that of the power amplified output by the power amplifying circuit 67. In the case that the power amplifying process operation is stopped in response to the logic level of this transmit data stream TX, since the output terminals of the field-effect transistors T1 and T2 are maintained as high impedances, these field-effect transistors T1 and T2 do not give the load to the power amplifying circuit 67.

As a consequence, both the power amplifying circuits 67 and 68 may each constitute a tri-state buffer circuit.

The first transmitting circuit 65A supplies the power amplified output of the power amplifying circuit 68 to one terminal of the loop antenna 28, and also supplies via a resistor 69, the power amplified output of the power amplifying circuit 67 to one terminal of this loop antenna 28. As a result, the transmitting circuit 65A adds the power amplified output of the power amplifying circuit 67 to the power amplified output of the power amplifying circuit 68 via this resistor 69 so as to produce an ASK modulation signal SMA. It should also be noted in the transmitting circuit 65A that a monitor terminal TMA is arranged at the output terminal of the power amplifying circuit 67.

In contrast to the above arrangement, the second transmitting circuit 65B is constituted in the same manner to that of the first transmitting circuit 65A except that a buffer amplifying circuit 71 constructed of an inverting amplifier circuit arrangement is arranged instead of the buffer amplifying circuit 66 employed in the first transmitting circuit 65A, and furthermore, except that the power-amplified output is supplied to the other terminal of the loop antenna 28. As a result, the second transmitting circuit 65B produces another ASK modulation signal "SMB" whose phase is inverted in conjunction with the first transmitting circuit 65A. This second transmitting circuit 65B drives the loop antenna 28 by using this ASK modulation signal SMB.

Operations of First Embodiment

With employment of the above-described circuit arrangements, in the IC card system 21 (see FIG. 7 and FIG. 8), the transmit data stream "D(R→C)" which is sent from the IC card reader/writer 23 to the IC card 22 is ASK-modulated by the modulating/demodulating circuit 29, and then, the ASK-modulated transmit data stream is transmitted via the loop antenna 28.

As a result, when the IC card 22 is approached to the reader/writer 23, the transmission signal SM is induced by this ASK modulation signal in the loop antenna 24 of this IC card 22. A portion of this induced transmission signal SM is converted into electric power used in the IC card 22. This converted electric power may drive the modulating/demodulating circuit 25 and the signal processing circuit 26 of the IC card 22.

Furthermore, as to the transmission signal SM obtained from this loop antenna 24, the transmit data stream "D(R→C)" is demodulated by the modulating/demodulating circuit 25, and this transmit data stream "D(R→C)" is analyzed by the signal processing circuit 26 so as to produce the response data stream "D(C→R)" which is transmitted to the reader/writer 23. In the IC card 22, this response data stream "D(C→R)" -is ASK-modulated by the modulating/demodulating circuit 25, and as a result, this resulting ASK modulation signal SM is transmitted as a response signal from the loop antenna 24.

As a consequence, the response data stream "D(C→R)" is transmitted from the IC card 22 to the reader/writer 23. The response signal SM which has been transmitted in this manner is received by the reader/writer 23 by way of the loop antenna 28 which is coupled to the loop antenna 24. Then, the response data stream "D(C→R)" is demodulated by the modulating/demodulating circuit 29.

The transmit data stream "D(R→C)" which are transmitted/received in this manner is ASK-modulated by the ASK modulating circuit 47, and thereafter, the ASK-modulated transmit data stream is power-amplified by the power amplifying circuit 48. Then, the amplified data stream is transmitted via the loop antenna 28.

In accordance with this first embodiment, when the transmit data stream "D(R→C)" is ASK-modulated by this ASK modulating circuit 47 and then, the ASK-modulated transmit data stream is power-amplified by the power amplifying circuit 48 (see FIG. 9), with respect to the power-amplified output of the power amplifying circuit 59 for power-amplifying the carrier signal SC by a predetermined phase, the power-amplified output of the power amplifying circuit 62 for similarly power-amplifying the carrier signal SC by a preselected phase is gated to be added in response to the logic level of the transmit data stream "D(R→C)". As a consequence, the power-amplified ASK modulation signal is produced.

Accordingly, the respective power amplifying circuits 59 and 62 can be designed by mainly considering the power efficiency without considering the linearity thereof to some extent. Therefore, the power efficiencies of these power amplifying circuit 59 and 62 can be increased, as compared with those of the conventional power amplifying circuits. Also, these power amplifying circuits 59 and 62 may be constituted by employing the commercially available electronic components.

To the contrary, as to the ASK modulation, the output signals are merely gated in the power amplifying circuits 59 and 62, so that the ASK modulation signal can be produced. Therefore, the output signals can be ASK-modulated by a simple circuit arrangement suitably manufactured as an integrated circuit. Also, the power efficiency can be increased.

Concretely speaking, with respect to both the power amplifying circuit 67 and the power amplifying circuit 68, which are arranged by the tri-state buffer circuits, and amplify the carrier signal SC by the same phase (see FIG. 12), in one power amplifying circuit 67, when the transmit data stream "D(R→C)" is sent out, the carrier signal SC is continuously power-amplified. In contrast thereto, in the other power amplifying circuit 68, since the carrier signal SC is power-amplified in response to the logic level of the transmit data stream "D(R→C)", this power-amplified result is gated based on the logic level of the transmit data stream "D(R→C)", and then these power-amplified results of the power amplifier circuits 67 and 68 are added to each other via the resistor 69, so that the loop antenna 28 is driven by this added signal. As a result, in both the terminals of the loop antenna 28, the amplitude of the power-amplified carrier signal SC is varied in response to the logic level of the transmit data stream "D(R→C)", so that the loop antenna 28 is driven by both the ASK modulation signals SMA and SMB.

Accordingly, the respective power amplifying circuits 67 and 68 can be designed by mainly considering the power efficiency without considering the linearity thereof to some extent. Therefore, the power efficiencies of these power amplifying circuits 67 and 68 can be increased, as compared with those of the conventional power amplifying circuits. Also, these power amplifying circuits 67 and 68 may be constituted by employing the commercially available electronic components.

Also, as to the ASK modulation, the power amplifying process operation executed by the power amplifying circuit 68 is simply and intermittently controlled to be stopped and the output signal is merely gated, so that the ASK modulation signal can be produced. As a result, the ASK modulation can be carried out by using a simplified circuit arrangement suitable for manufacturing this circuit arrangement as the IC. Also, the power efficiency can be increased.

As previously explained, the power amplifying circuits 67 and 68 for power-amplifying the carrier signal are constituted by series-connecting the P-channel field-effect transistor T1 to the N-channel field-effect transistor T2 (see FIG. 13). The power amplifying process operation may be stop-controlled by such a manner that while the gate voltages of these P-channel/N-channel field-effect transistors T1/T2 are varied higher than, or equal to the source-to-drain voltage, these gate voltages are kept in the H level and the L level, respectively.

As a consequence, when the transmit data stream "D(R→C)" is transmitted, in contrast to the power amplifier circuit 67 for continuously power-amplifying the carrier signal SC, in such a power amplifying circuit 68 for intermittently power-amplifying the carrier signal in response to the logic level of the transmit data stream "D(R→C)", the output terminal thereof is maintained under high impedance state within a time period during which the power amplifying process operation is stopped. The power-amplified output of the power amplifying circuit 67 is not consumed by the power amplifying circuit 68 whose amplifying operation is stopped. As a result, this control operation can increase the power efficiency. Also, since substantially no source currents of these field-effect transistors T1 and T2 will flow, this may increase the power efficiency.

Advantages of First Embodiment

In accordance with the above-described circuit arrangement of the first embodiment, with respect to the power-amplified output of the power amplifying circuit 59 for power-amplifying the carrier signal SC by a predetermined phase, the power-amplified output of the power amplifying circuit 59 for similarly power-amplifying the carrier signal SC by a preselected phase is gated to be added in response to the logic level of the transmit data stream "D(R→C)". As a consequence, the power-amplified ASK modulation signal can be produced by employing the power amplifying circuits which are designed by mainly considering the power efficiency without considering the linearity thereof to some extent. Therefore, the power efficiencies of these power amplifying circuit can be increased, as compared with those of the conventional power amplifying circuits. Also, these power amplifying circuits may be constituted by employing the commercially available electronic components. Also, these power amplifying circuits can be simply and readily manufactured in the form of ICs in connection with other circuit blocks. Both the modulating circuit and the power amplifying circuits, the efficiencies of which are further increased, can be obtained.

Also, since the power amplifying circuit is constituted by employing the tri-state buffer circuit type amplifying circuit, the power efficiency can be improved by the simple control operation. This tri-state buffer circuit switches the output terminal into the high impedance when the operation is stopped. As a consequence, these power amplifying circuits can be simply and readily manufactured in the form of ICs in connection with other circuit blocks. The power amplifying circuits, the efficiencies of which are further increased, can be obtained.

ASK Modulating Circuit of Second Embodiment

Figure 15:
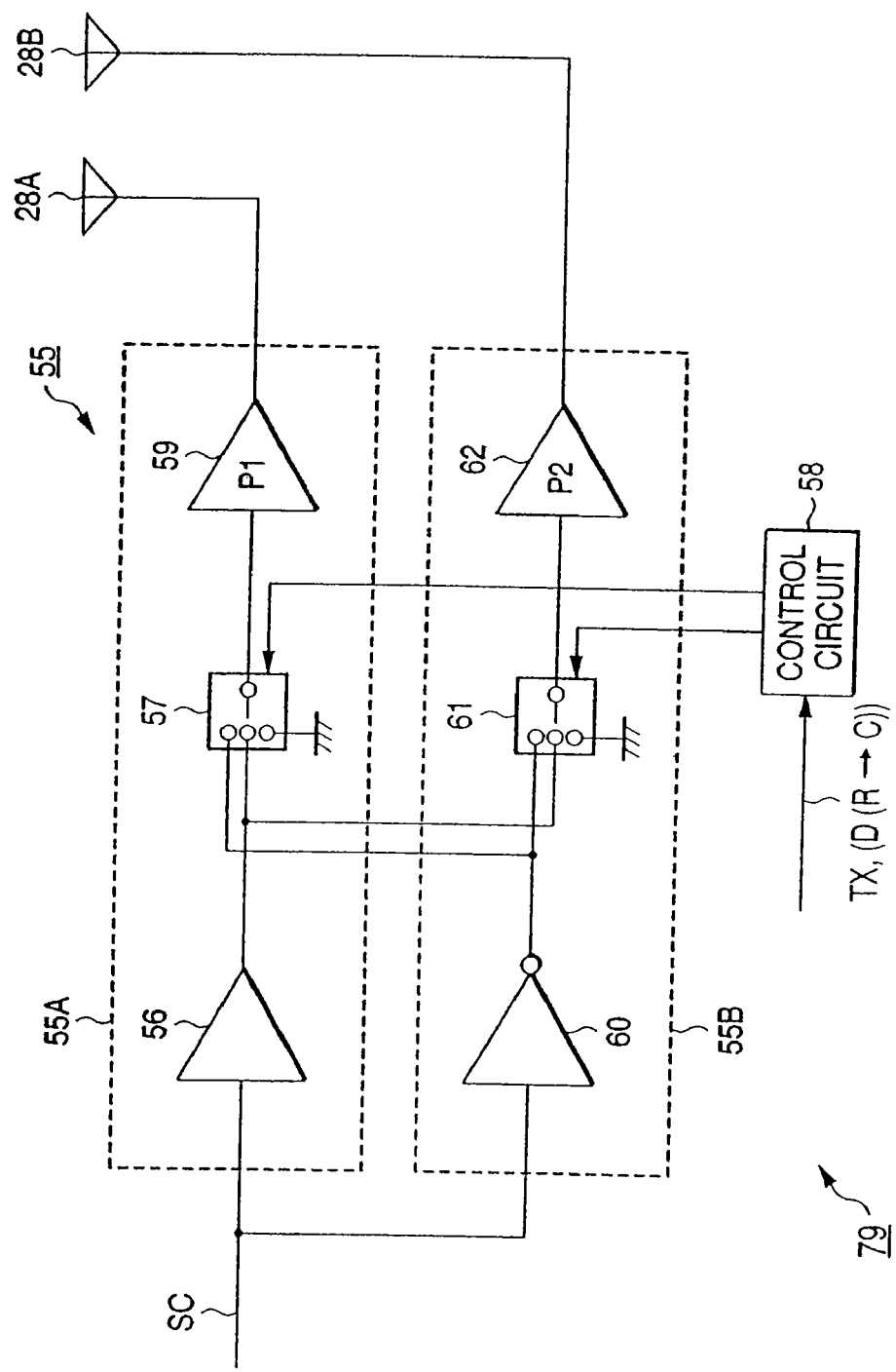
FIG. 15 is a schematic block diagram for representing a modulating circuit applied to an IC card reader/writer, according to a second embodiment of the present invention.

As shown in FIG. 15 in contrast with FIG. 9, there is indicated a basic idea of an ASK modulating circuit applied to a second embodiment of the present invention. In this ASK modulating circuit 79, the power-amplified results obtained from the power amplifying circuits 59 and 62 are supplied to two signal paths of antennas 28A and 28B, respectively. These two power-amplified results are added to each other in electromagnetic fields transmitted from the antennas 28A and 28B.

As represented in FIG. 15, even when the ASK modulating circuit is so arranged that these two power-amplified results are added to each other in the electromagnetic fields, it is possible to achieve a similar effect to that of the first embodiment.

ASK Modulating Circuit of Third Embodiment

Figure 16:
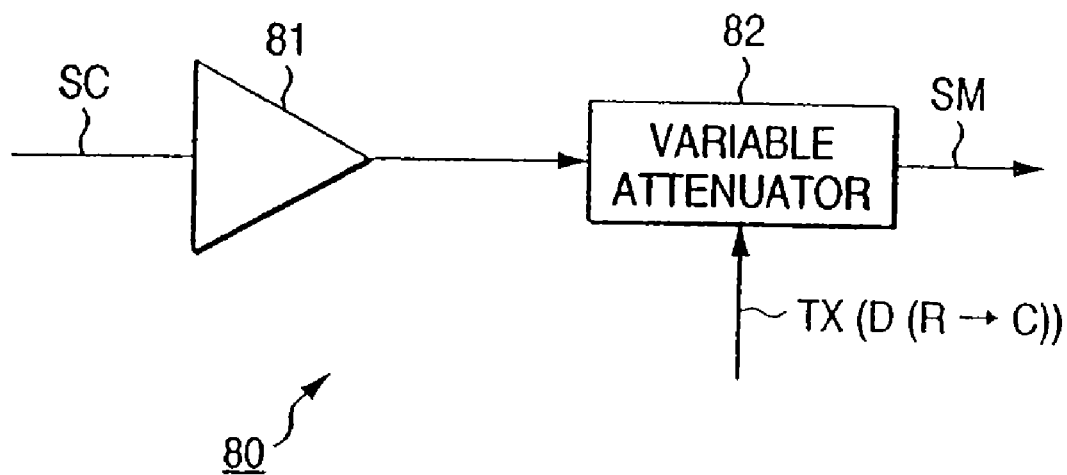
FIG. 16 is a schematic block diagram for representing a basic structure of a modulating circuit applied to an IC card reader/writer, according to a third embodiment of the present invention.

FIG. 16 is a block diagram for representing a basic arrangement of an ASK modulating circuit applied to a third embodiment of the present invention. In this third embodiment, this ASK modulating circuit 80 is applied instead of the ASK modulating circuit 47 and the power amplifying circuit 48 (see FIG. 8) of the reader/writer 23.

In other words, in the ASK modulating circuit 80, after the carrier signal is amplified by the power amplifying circuit 81, the amplified carrier signal is outputted via a variable attenuator 82. In response to the transmit data stream TX(D (R→C)), the variable attenuator 82 attenuates this carrier signal to thereby output the attenuated carrier signal. As a result, this ASK modulating circuit 80 outputs such an ASK modulation signal SM, the amplitude of which is varied in response to the transmit data stream TX(D(R→C)).

Figure 17:
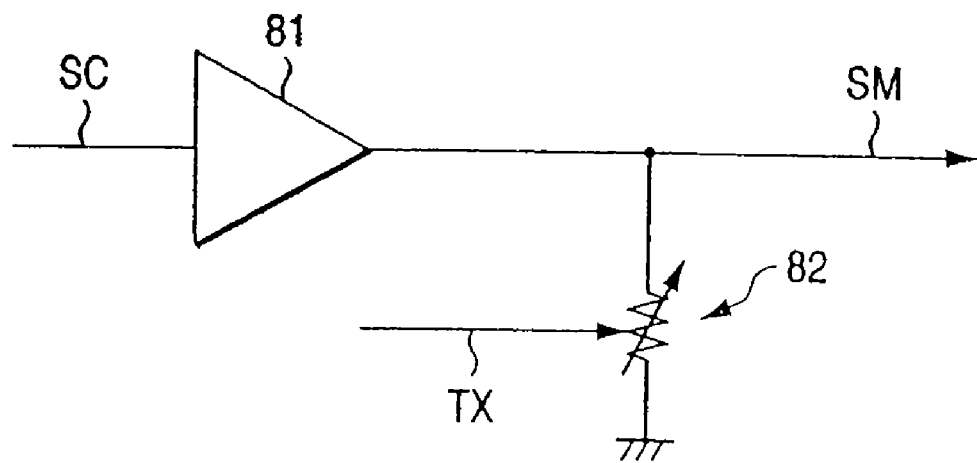
FIG. 17 is a connection diagram for explaining a variable attenuator shown in FIG. 16.
Figure 18:
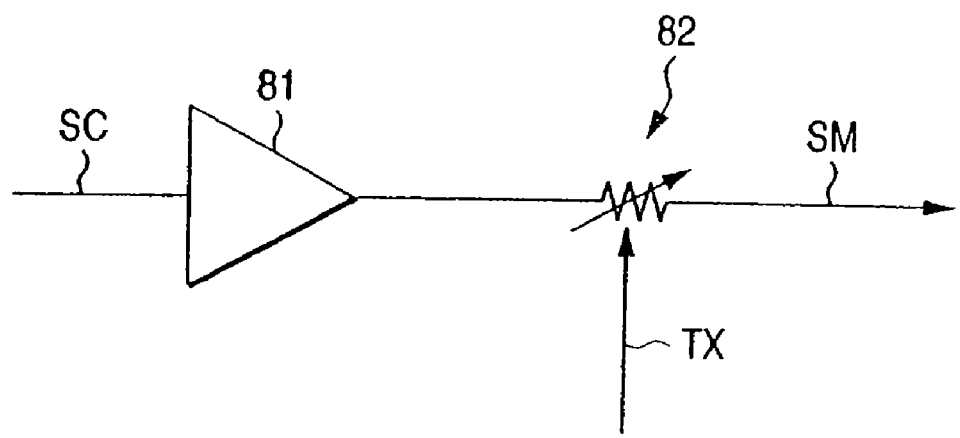
FIG. 18 is a connection diagram for explaining a grounded type variable attenuator as to the variable attenuator of FIG. 16.
Figure 19:
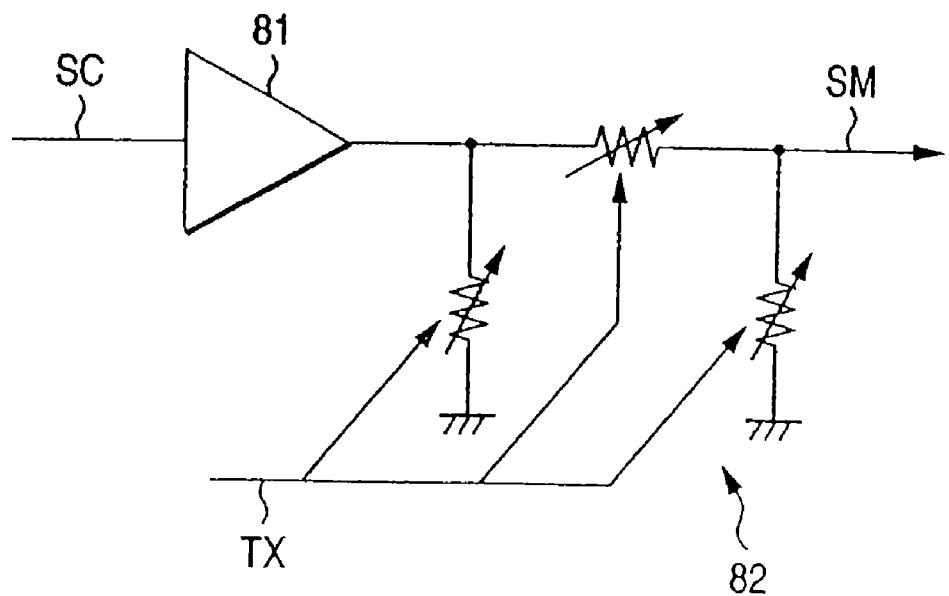
FIG. 19 is a connection diagram for explaining a combined structure between the arrangement shown in FIG. 17 and the arrangement shown in FIG. 18 as to the variable attenuator of FIG. 16.

As a typical variable attenuator type, for example, the variable attenuator 82 as shown in FIG. 17 is arranged by which a transfer path is terminated; the variable attenuator 82 as shown in FIG. 18 is arranged which is inserted in series of a transfer path; and also, as represented in FIG. 19, two sets of the above-explained variable attenuators are combined with each other.

Figure 20:
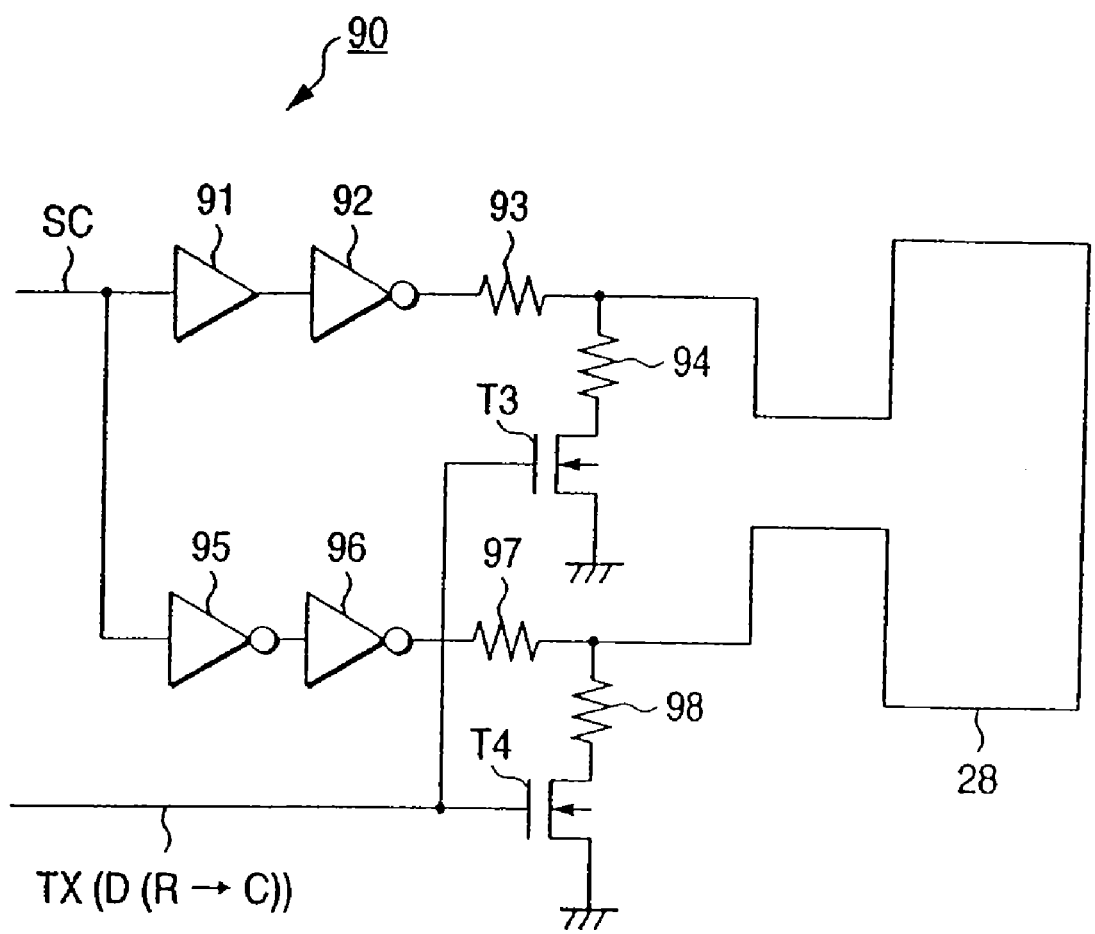
FIG. 20 is a schematic block diagram for showing a concrete circuit arrangement of the modulating circuit shown in FIG. 16.

In further detail, in the ASK modulating circuit according to this third embodiment, such an ASK modulating circuit as indicated in FIG. 20 is applied. That is, in the ASK modulating circuit 90, the carrier signal SC is entered into the buffer amplifying circuit 91, and then, the output signal of this buffer amplifying circuit 91 is amplified by the power amplifying circuit 92. The power amplifying circuit 92 supplies the power-amplified result via a resistor 93 to one terminal of the loop antenna 28. This one terminal of the loop antenna 28 is connected through another resistor 94 and a field-effect transistor T3 to the ground. As a result, in the ASK modulating circuit 90, the variable attenuator may be constituted in such a way that the attenuation amount is switched by ON/OFF-controlling the field-effect transistor T3, and the power-amplified result outputted from the power amplifying circuit 92 is ASK-modulated by this variable attenuator.

Also, in the ASK modulating circuit 90, the carrier signal SC is inputted to another buffer amplifying circuit 95 arranged as an inverting amplifier circuit, and then, the output signal of this buffer amplifying circuit 95 is amplified by the power amplifying circuit 96. The power amplifying circuit 96 supplies the power-amplified result via another resistor 97 to the other terminal of the loop antenna 28. The other terminal of the loop antenna 28 is connected through another resistor 98 and a field-effect transistor T4 to the ground. As a result, in the ASK modulating circuit 90, the variable attenuator may be constituted in such a way that the attenuation amount is switched by ON/OFF-controlling the field-effect transistor T4, and the power-amplified result outputted from the power amplifying circuit 96 is ASK-modulated by this variable attenuator.

In accordance with the circuit arrangement of the third embodiment, on the output side of the power amplifying circuit, the power-amplified result is attenuated in response to the transmit data stream TX so as to produce the ASK modulation signal SM. As a consequence, in the power amplifying circuit, the carrier signal is amplified without saving the amplitude component, so that the ASK modulation signal can be produced. Accordingly, the power amplifying circuit can be operated in the saturation region, and the power amplifying circuit can be arranged by employing such general-purpose logic ICs as CMOS standard logic ICs and TTL circuits. As a result, the power efficiency can be increased as compared with the conventional power amplifying circuit. The ASK modulating circuit can be arranged by employing the commercially available general-purpose electronic components. The ASK modulating circuit of the third embodiment can be simply and easily manufactured together with other circuit blocks in the IC form. Moreover, it is possible to arrange the modulating circuit and the power amplifying circuit, which can be operated in higher efficiencies.

ASK Modulating Circuit of Fourth Embodiment

Figure 21:
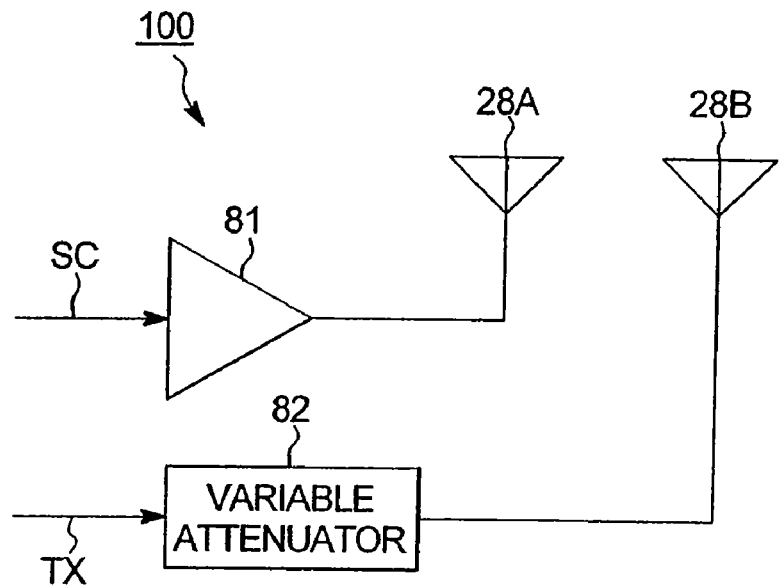
FIG. 21 is a schematic block diagram for indicating a modulating circuit applied to an IC card reader/writer, according to a fourth embodiment of the present invention.

As shown in FIG. 21 in contrast with FIG. 16, there is indicated a basic idea of an ASK modulating circuit applied to a fourth embodiment of the present invention. In this ASK modulating circuit 100, the power-amplified result obtained from the power amplifying circuit 81 is supplied to the first antenna 28A, and the variable attenuator 82 is connected to the second antenna 28B electromagnetically coupled to this first antenna 28A. As a result, in this ASK modulating circuit 100, an electromagnetic field radiated from the first antenna 28A is varied in response to the transmit data stream TX via the second antenna 28B, so that an ASK modulation signal is radiated toward the IC card.

In accordance with the circuit arrangement shown in FIG. 21, even when the power-amplified result is attenuated to produce the ASK modulation signal SM in the electromagnetic field produced on the output side of the power amplifying circuit, it is possible to achieve a similar effect to that of the third embodiment.

ASK Demodulating Circuit of Fifth Embodiment

Figure 22:
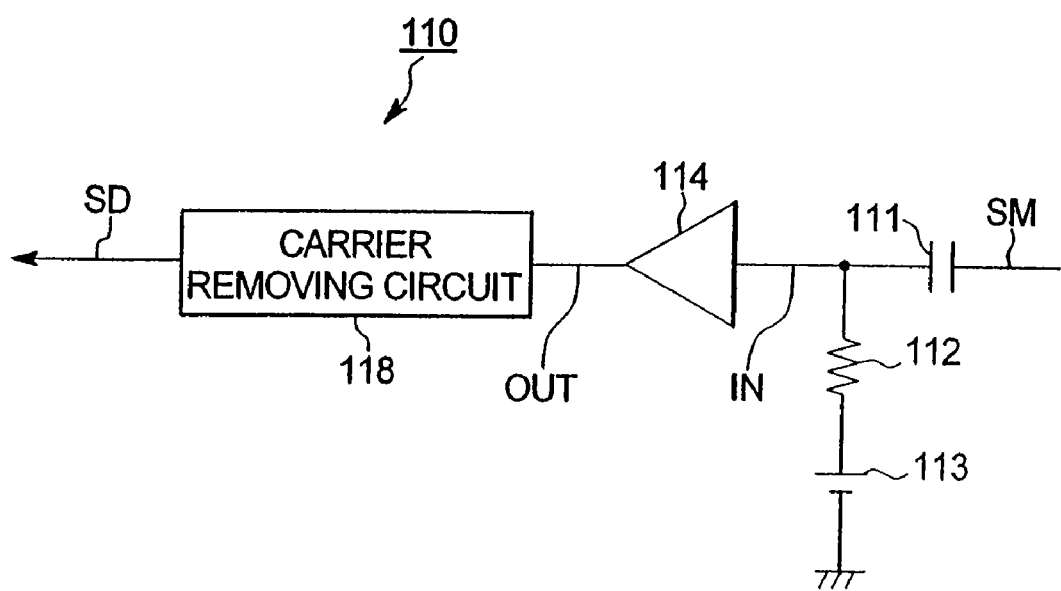
FIG. 22 is a schematic block diagram for showing a basic structure of a demodulating circuit applied to an IC card reader/writer, according to a fifth embodiment of the present invention.

FIG. 22 is a block diagram for representing a basic arrangement of an ASK demodulating circuit in accordance with a fifth embodiment of the present invention. In this fifth embodiment, this ASK demodulating circuit 110 is utilized instead of the ASK detecting circuit 49 and the low-pass filter 50 (see FIG. 8).

Figure 23:
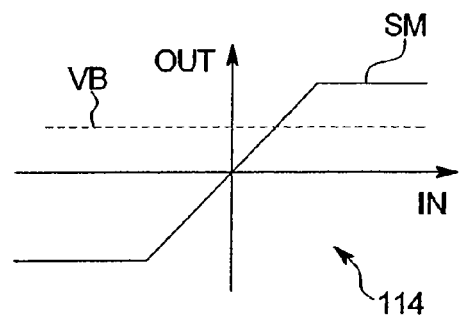
FIG. 23 is a characteristic curve diagram for explaining a bias of a modulation signal used in FIG. 22.

This ASK demodulating circuit 110 receives the output signal SM of the loop antenna 28 via a coupling capacitor 111. This output signal SM is biased by a preselected voltage VB by a resistor 112 and a DC power supply 113. In this case, this bias voltage VB is set, as shown in a graphic representation of FIG. 23, to such an extent that only a half wave of an input signal can be hardly amplified in a post-staged amplifying circuit 114. As a result, in this ASK demodulating circuit 110, the response signal SM obtained via the loop antenna 28 is half-wave-rectified by the amplifying circuit 114, and then, as to the ASK modulation signal corresponding to the response signal, a baseband converted component of a sideband wave signal made by multiplying a carrier wave by a sideband wave signal is produced. As a result, this baseband converted component may constitute a demodulation signal SD of the ASK modulation signal.

Figure 24:
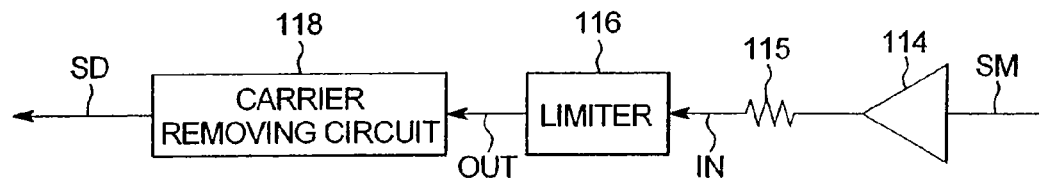
FIG. 24 is a schematic block diagram for showing a circuit arrangement constituted by replacing the bias of the demodulating circuit shown in FIG. 22 by a limiter.
Figure 25:
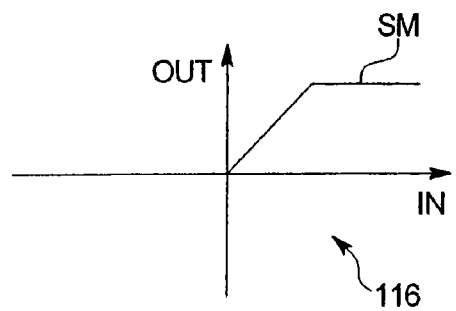
FIG. 25 is a characteristic curve diagram for explaining an amplitude limiter in the circuit arrangement of FIG. 24.

Alternatively, a limiter is arranged on the output side of the amplifying circuit 114 as shown in FIG. 24, and then, only the half wave of the response signal SM is amplified as represented in FIG. 25. As a result, the baseband converted component of the side-band wave signal may be produced.

A carrier removing circuit 118 removes an ASK modulation signal component from such an output signal of the amplifying circuit 114, into which the demodulation signal SD produced in this manner has been mixed, and then outputs the removed ASK modulation signal component. It should be understood that the ASK modulation signal component is removed from a limiter output of a limiter 116 in the circuit arrangement of FIG. 24.

Also, it should be understood that with this type of amplifying circuit 114, an amplifier circuit which employs a transistor and a field-effect transistor, and a differential amplifying circuit may be utilized. Also, as the carrier removing circuit 118, a low-pass filter, a band-pass filter, and a trap filter may be applied in accordance with the frequency band of the demodulation signal SD.

Figure 26:
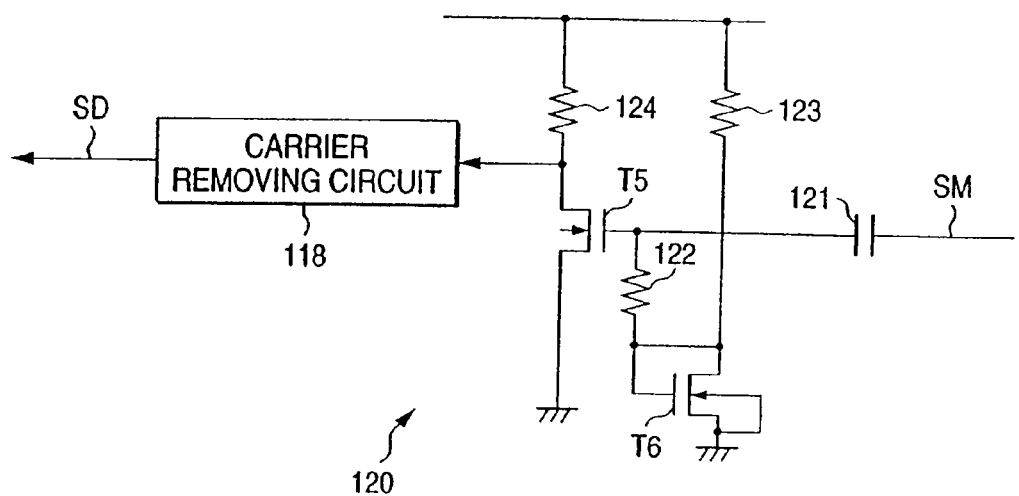
FIG. 26 is a schematic block diagram for representing a concrete arrangement of the demodulating circuit shown in FIG. 22.

In further detail, such a circuit arrangement as indicated in FIG. 26 is applied to the ASK demodulating circuit according to this fifth embodiment. That is to say, in the ASK demodulating circuit 120, the output signal SM of the loop antenna 28 is inputted via a coupling capacitor 121 to a field-effect transistor T5.

In this case, this field-effect transistor T5 may constitute a source-grounded type amplifying circuit having a drain resistor 124, to which a gate voltage is biased by a diode-connected field-effect transistor T6, and resistors 122 and 123. As a result, the ASK modulation signal SM input to the gate of the field-effect transistor T5 is biased only by a predetermined voltage, so that this field-effect transistor T5 amplifies only the input signal wave along a positive direction.

In the fifth embodiment, since only the half wave of the input signal is amplified by setting the bias voltage so as to remove the carrier component, the ASK modulation signal can be demodulated by such a simple circuit arrangement. As a consequence, this ASK demodulating circuit can be simply and easily manufactured in the IC form in combination with other circuit blocks. Furthermore, it is possible to achieve the demodulating circuit operable in the high efficiency.

ASK Demodulating Circuit of Sixth Embodiment

Figure 27:
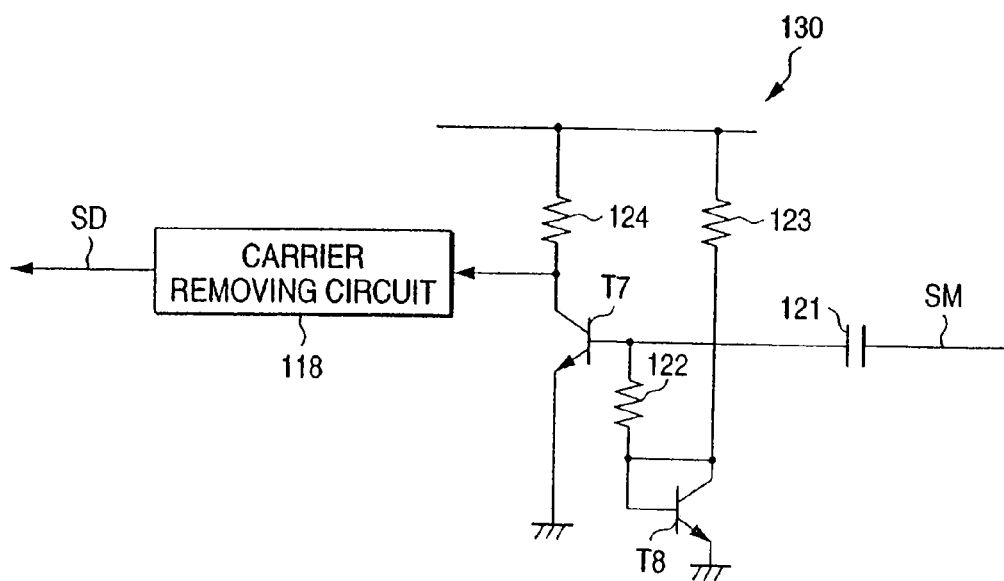
FIG. 27 is a schematic block diagram for indicating a modulating circuit applied to an IC card reader/writer, according to a sixth embodiment of the present invention.

As shown in FIG. 27 in contrast with FIG. 26, there is indicated schematic block diagram of an ASK demodulating circuit according to a sixth embodiment of the present invention. In this ASK demodulating circuit 130, transistors T7 and T8 are used instead of the field-effect transistors T5 and T6.

In accordance with the circuit arrangement shown in FIG. 27, even when transistors T7 and T8 are used instead of the field-effect transistors T5 and T6, it is possible to achieve a similar effect to that of the fifth embodiment.

ASK Demodulating Circuit of Seventh Embodiments

Figure 28:
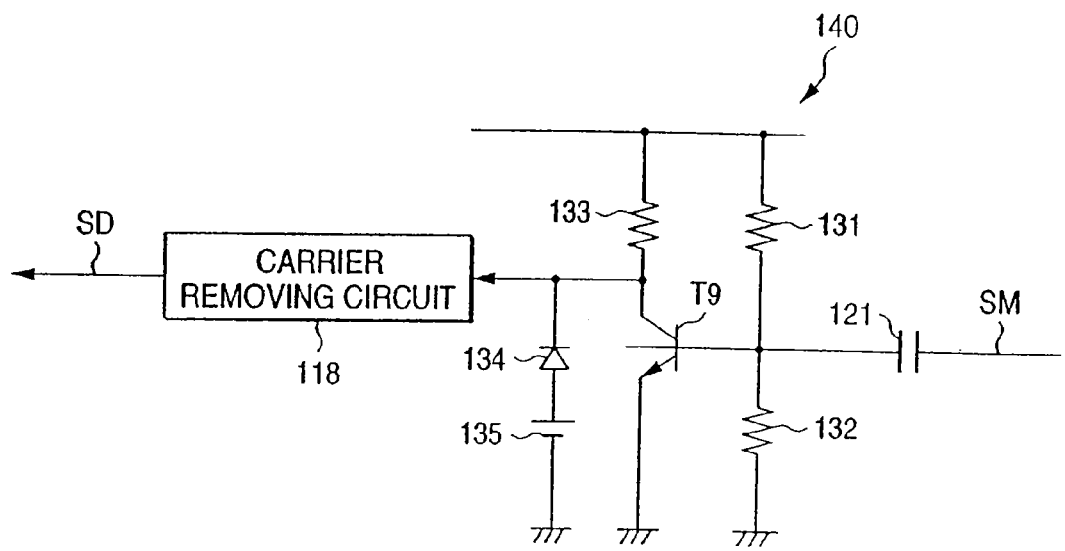
FIG. 28 is a schematic block diagram for showing a demodulating circuit applied to an IC card reader/writer, according to a seventh embodiment of the present invention.

FIG. 28 is a schematic block diagram of an ASK demodulating circuit according to a seventh embodiment of the present invention, as shown in contrast with FIG. 26. In this ASK demodulating circuit 140 of the seventh embodiment, the ASK modulation signal SM entered via the coupling capacitor 121 is amplified by an emitter-grounded type amplifying circuit constructed of resistors 131 to 133, and a transistor T9, and thereafter, the amplified ASK modulation signal SM is entered into the carrier removing circuit 118.

Furthermore, the amplitude of the signal outputted from this emitter-grounded type amplifying circuit is limited by a limiter constituted by a diode 134 and a constant voltage power supply 135, which are arranged at the input terminal of this carrier removing circuit 118. As a result, only a half wave of the amplified signal result is input into the carrier removing circuit 118 so as to convert a side-band wave component into a baseband component.

In accordance with the circuit arrangement shown in FIG. 28, even when only the half wave of the modulation signal is amplitude-limited on the output side of the amplifying circuit, it is possible to achieve a similar effect to that of the above-described fifth embodiment.

ASK Demodulating Circuit of Eighth Embodiment

Figure 29:
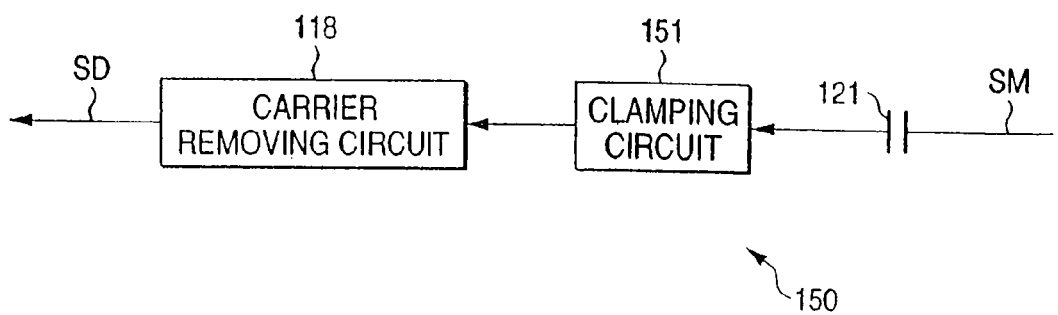
FIG. 29 is a schematic block diagram for showing a basic structure of a demodulating circuit applied to an IC card reader/writer, according to an eighth embodiment of the present invention.

FIG. 29 is a block diagram for representing a basic arrangement of an ASK demodulating circuit utilized to an eighth embodiment of the present invention. In this eighth embodiment, this ASK demodulating circuit 150 is applied instead of the ASK detecting circuit 49 and the low-pass filter 50 (see FIG. 8).

This ASK demodulating circuit 150 receives the output signal SM of the loop antenna 28 via the coupling capacitor 121. This output signal SM is entered into a clamping circuit 151. In this embodiment, this clamping circuit 151 clamps the entered ASK modulation signal SM so as to apply a waveform distortion to the ASK modulation signal SM. As a result, the ASK demodulating circuit 150 converts the side-band wave component of the ASK modulation signal SM into a baseband component.

Figure 30:
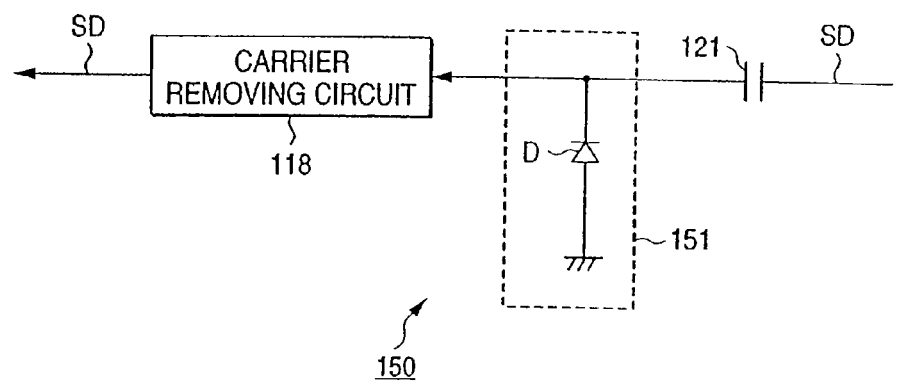
FIG. 30 is a schematic block diagram for representing a concrete arrangement of the demodulating circuit shown in FIG. 29.

In further detail, in the ASK demodulating circuit according to this eighth embodiment, a circuit arrangement shown in FIG. 30 is utilized. That is, in this ASK demodulating circuit 150, the output terminal of the coupling capacitor 121 is grounded by using a diode D having a reverse polarity in order to clamp the ASK modulation signal.

In accordance with the eighth embodiment, since the amplitude of the ASK modulation signal is limited and the circuit arrangement is suitably manufactured in the IC form by the grounded type diode, this amplitude limiting means can be formed. As a consequence, this ASK demodulating circuit can be simply and easily manufactured in the IC form in combination with other circuit blocks. Furthermore, it is possible to achieve the demodulating circuit operable in the high efficiency.

ASK Demodulating Circuit of Ninth Embodiment

Figure 31:
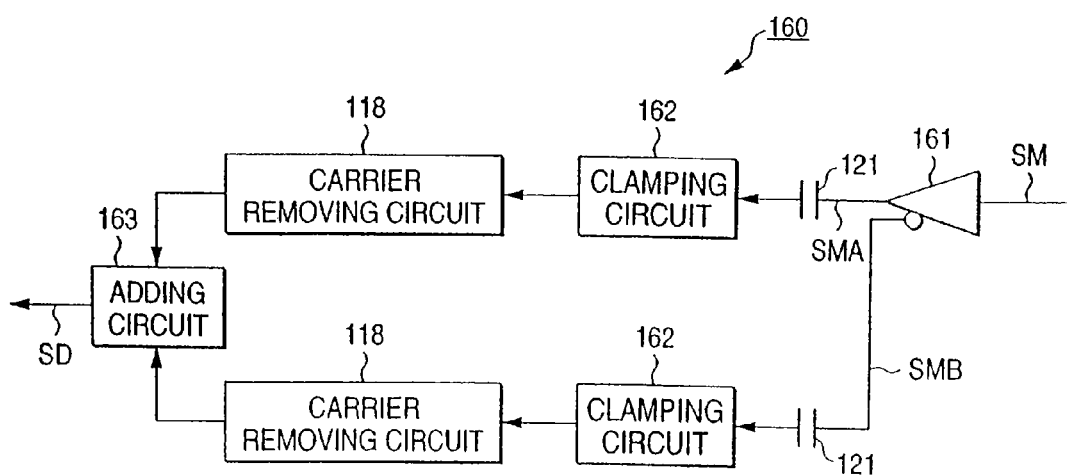
FIG. 31 is a schematic block diagram for showing a demodulating circuit applied to an IC card reader/writer, according to a ninth embodiment of the present invention.

FIG. 31 is a block diagram for representing a basic arrangement of an ASK demodulating circuit according to a ninth embodiment of the present invention. In this ninth embodiment, this ASK demodulating circuit 160 is applied instead of the ASK detecting circuit 49 and the low-pass filter 50 (see FIG. 8).

In this ASK demodulating circuit 160, the ASK modulation signal SM is entered into an amplifying circuit 161 so as to produce an ASK modulation signal SMA having an in-phase and another ASK modulation signal SMB having a reverse phase with respect to the phase of the first-mentioned ASK modulation signal SM. Then, the ASK demodulating circuit 160 inputs these ASK modulation signals SMA and SMB via the coupling capacitor 121 to the clamping circuit 162. In this case, both the ASK modulation signals SMA and SMB are clamped by the clamping circuit 162 based on the substantially same signal level. Waveform distortion is applied to these ASK modulation signals SMA and SMB at the substantially same degree.

The ASK demodulating circuit 160 inputs to a carrier removing circuits 118, such ASK modulation signals SMA and SMB to which the waveform distortion is applied and also which contain the demodulation signal SD, so that signal components of these ASK modulation signals SMA and SMB are removed. Thereafter, this ASK demodulating circuit 160 enters the output signals of the carrier removing circuit 118 into an adding circuit 163. In this adding circuit 163, since these output signals are added to each other, the cross modulation components which are contained in the demodulation signal SD by applying the waveform distortion are removed by cancellation. Alternatively, the demodulation signal may be extracted with high efficiency by employing the averaging process operation instead of this adding process operation.

Figure 32:
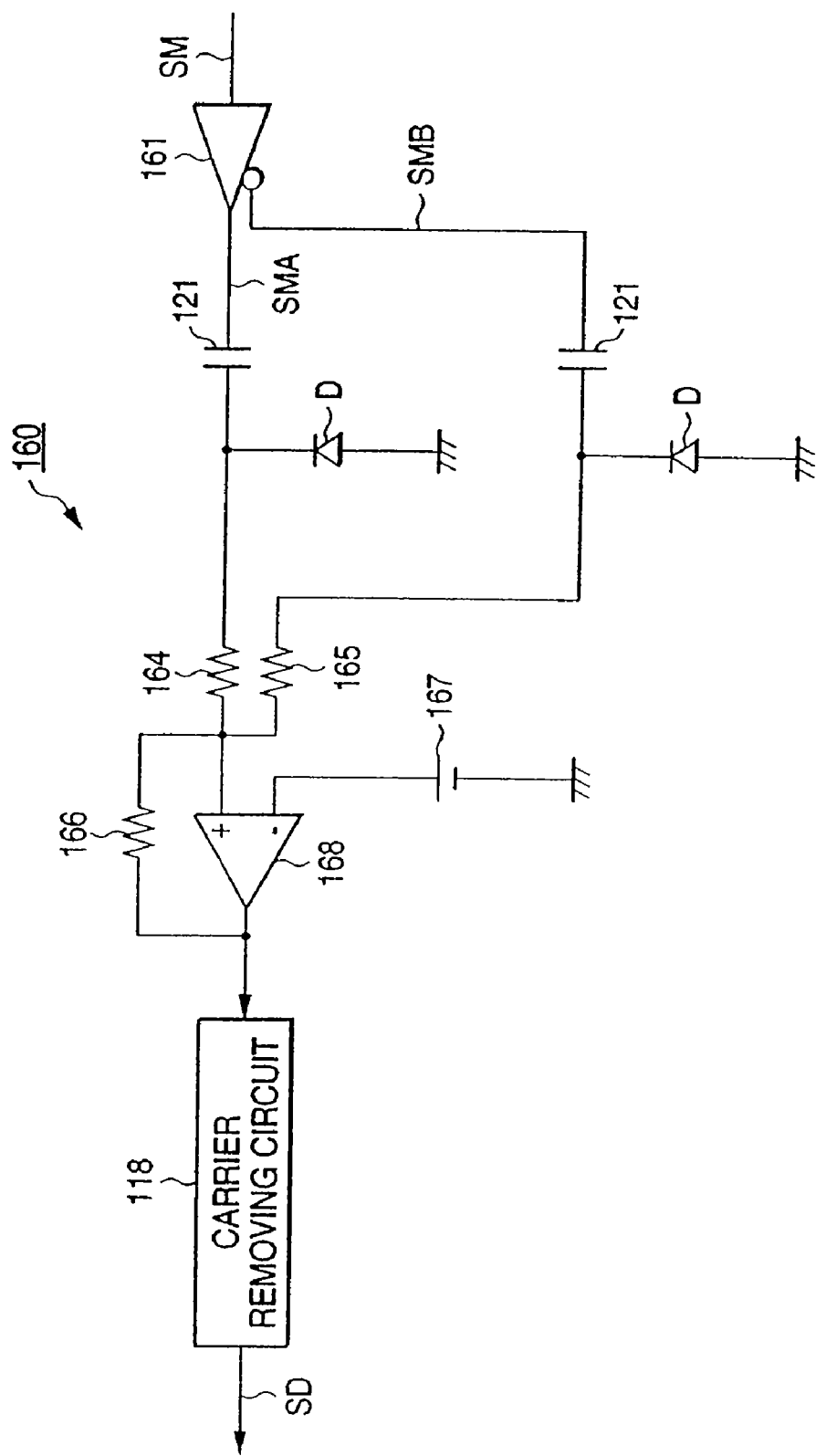
FIG. 32 is a schematic block diagram for representing a concrete arrangement of the demodulating circuit shown in FIG. 31.

In further detail, in the ASK demodulating circuit 160 according to this ninth embodiment, a circuit arrangement shown in FIG. 32 may be utilized. In other words, in the ASK demodulating circuit 160, the ASK modulation signal SMA having the in-phase and the ASK modulation signal SMB having the reverse phase are clamped by the diodes D, respectively.

Furthermore, in the ASK demodulating circuit 160, the ASK modulation signals SMA and SMB, whose amplitudes have been limited in the above-described manner, are added to each other by an adding circuit arranged as a non-inverting amplifier circuit made of resistors 164 to 166, a bias power supply 167, and an operational amplifier circuit 168. As a result, the cross modulation component is canceled together with the ASK modulation signal component, and the demodulation signal components commonly contained in the ASK modulation signals SMA and SMB to which the waveform distortion is given. Thereafter, this ASK demodulating circuit 160 limits the frequency band by using the carrier removing circuit 118 to thereby output the demodulating signal SD.

In accordance with the ninth embodiment, the ASK modulation signal having the reverse phase is clamped and the waveform distortion is applied thereto. Thereafter, these ASK modulation signals are added to each other so as to cancel the unwanted signal component, so that the ASK modulation signal can be demodulated by the simple circuit arrangement. As a result, this ASK demodulating circuit can be simply and readily manufactured in the IC form together with other circuit blocks, and furthermore, such a demodulating circuit operable in a high efficiency can be obtained.

ASK Demodulating Circuit of Tenth Embodiment

Figure 33:
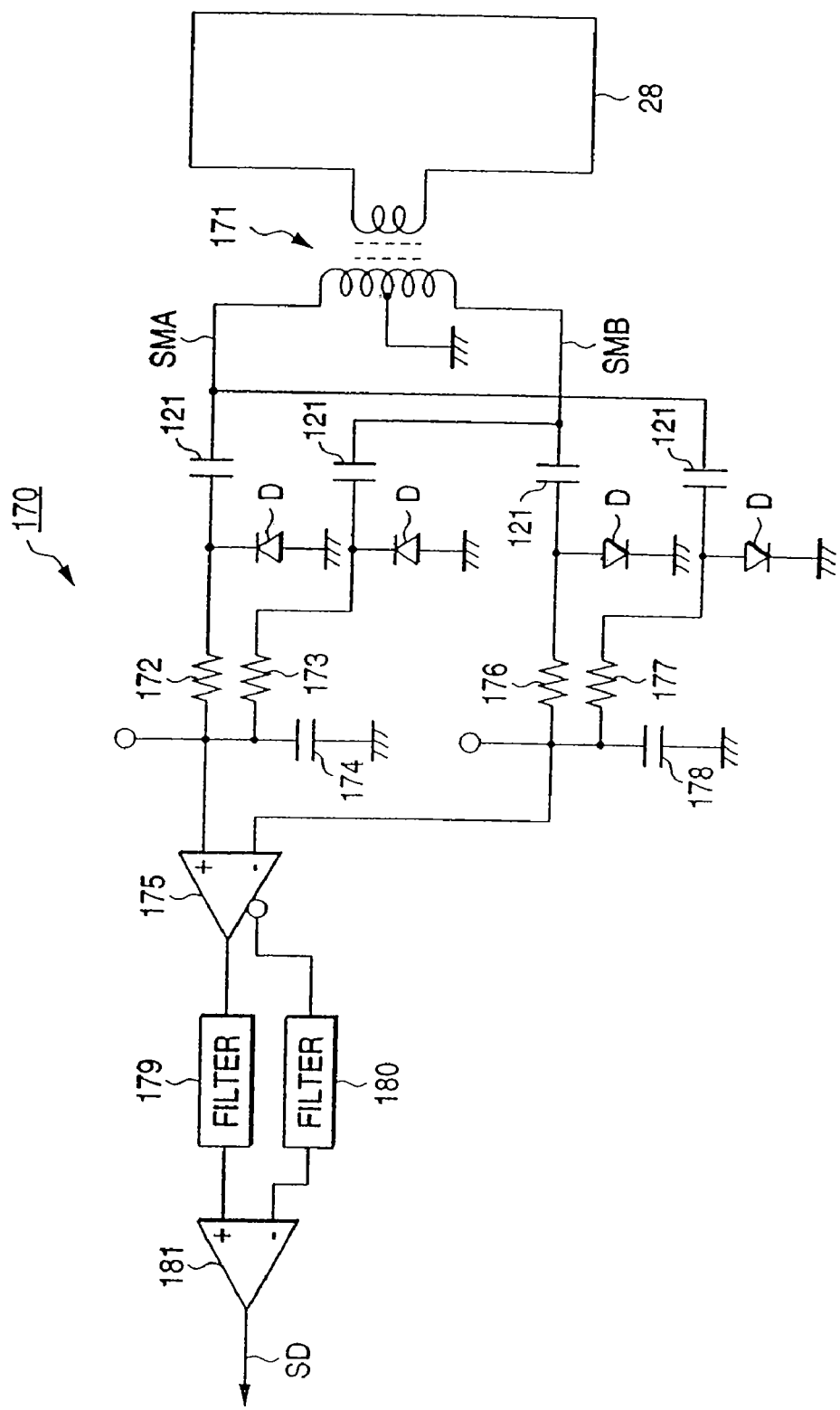
FIG. 33 is a schematic block diagram for showing a demodulating circuit applied to an IC card reader/writer, according to a tenth embodiment of the present invention.

FIG. 33 is a block diagram for representing a basic arrangement of an ASK demodulating circuit according to a tenth embodiment of the present invention. In this tenth embodiment, this ASK demodulating circuit 170 is applied instead of the ASK detecting circuit 49 and the low-pass filter 50 (see FIG. 8).

This ASK demodulating circuit 170 is arranged in such a manner that an ASK modulation signal is balance-outputted which is detected via a balance type transformer 171 by the loop antenna 28. As a result, the ASK modulation signals SMA and SMB having the phases opposite to each other can be produced without employing the above-described amplifying circuit 161 in FIG. 32.

In the ASK demodulating circuit 170, one ASK modulation signal SMA is clamped by a clamping circuit constructed of diodes, the clamping potentials of which are set to a positive polarity side and a negative polarity side, respectively. Similarly, the other ASK modulation signal SMB is clamped by another clamping circuit constructed of diodes, the clamping potentials of which are set to the positive polarity side and the negative polarity side, respectively.

Furthermore, with respect to the ASK demodulating circuit 170, in a low-pass filter circuit arranged by resistors 172, 173, and a capacitor 174, the ASK modulation signals SMA and SMB which are clamped at the clamping potentials on the positive potential side are added to each other by way of the resistors. The added result is entered into a non-inverting input terminal of a differential amplifying circuit 175. Similarly, in another low-pass filter circuit arranged by resistors 176, 177, and a capacitor 178, the ASK modulation signals SMA and SMB which are clamped at the clamping potentials on the negative potential side are added to each other by way of the resistors. The added result is entered into an inverting input terminal of the differential amplifying circuit 175.

As a result, the ASK demodulating circuit 170 may cancel the ASK modulation signal component, and also may extract the demodulation signal component which is clamped to be produced.

The frequency bands of both the non-inverting output and the inverting output derived from this differential amplifying circuit 175 are limited by the filters 179 and 180. As a result, after the ASK demodulating circuit 170 removes the ASK modulation signal component from the band-limited signal outputs, the resultant signals are added to each other by the differential amplifying circuit 181 and then this ASK demodulating circuit 170 outputs the added signal.

In accordance with this tenth embodiment, the balanced outputs are obtained from the antenna and then are clamped so as to demodulate the ASK modulation signal. Thus, the ASK modulation signal can be demodulated by employing the simpler circuit arrangement than that of the ninth embodiment.

Also, since the respective balanced outputs are clamped by the clamping circuits, the clamping potentials of which are set to the positive polarity side and the negative polarity side to be further processed, the ASK modulation signal can be processed with a higher efficiency than that of the ninth embodiment. Also, the S/N ratio of the demodulation result can be improved.

ASK Demodulating Circuit of Eleventh Embodiment

Figure 34:
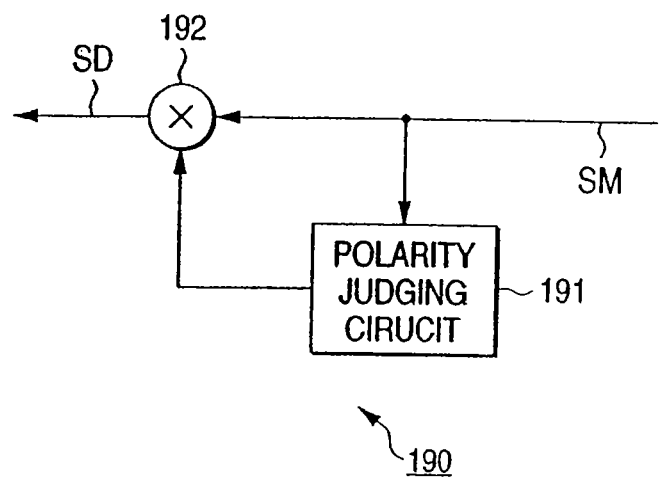
FIG. 34 is a schematic block diagram for showing a basic structure of a demodulating circuit applied to an IC card reader/writer, according to an eleventh embodiment of the present invention.

FIG. 34 is a block diagram for representing a basic arrangement of an ASK demodulating circuit according to an eleventh embodiment of the present invention. In this eleventh embodiment, this ASK demodulating circuit 190 is applied instead of the ASK detecting circuit 49 and the low-pass filter 50 (see FIG. 8).

This ASK demodulating circuit 190 executes a similar process operation, namely the ASK modulation signal SM is rectified by the full wave rectification by such that a polarity of the ASK modulation signal SM is judged in a polarity judging circuit 191, and then, the ASK modulation signal SM is multiplied by this polarity judgment result in a multiplying circuit 192. As a result, the demodulating circuit 190 demodulates the ASK modulation signal SM to thereby output a demodulation signal SD.

Figure 35:
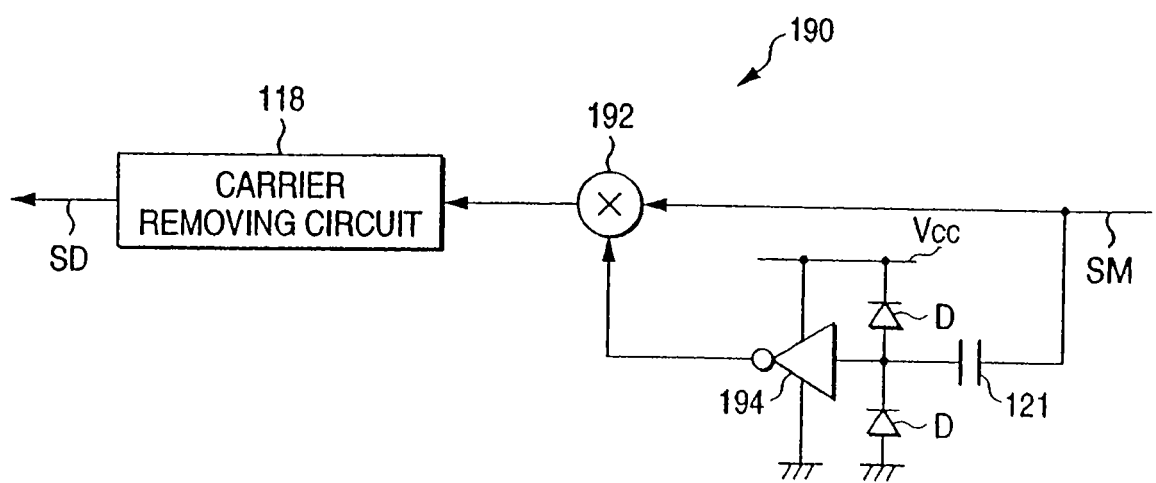
FIG. 35 is a schematic block diagram for representing a concrete arrangement of the demodulating circuit shown in FIG. 34.

In further detail, in the ASK demodulating circuit 190 according to this eleventh embodiment, a circuit arrangement shown in FIG. 35 is utilized. In other words, in this ASK demodulating circuit 190, the ASK modulation signal SM is inputted via the coupling capacitor 121 to an inverting amplifying circuit 194. In this case, an input terminal of the inverting amplifying circuit 194 is connected via diodes D to the ground and the power supply line. As a result, the inverting amplifying circuit 194 outputs such a polarity signal, by which the signal level is switched to both the positive side and the negative side in response to the polarity of the ASK modulation signal. As a consequence, the polarity judging circuit 191 is arranged by a limiter for amplitude-limiting the ASK modulation signal SM on the positive side and the negative side.

The ASK demodulating circuit 190 outputs the demodulation signal SD in such a manner that this polarity signal is multiplied by the ASK modulation signal SM in the multiplying circuit 192, and then, the multiplication result is band-limited by the carrier removing circuit 118. It should be noted in this embodiment that the multiplying circuit 192 is arranged by a double balanced mixer made of the Gilbert multiplier.

In accordance with the eleventh embodiment, since the polarity of the ASK modulation signal is judged by the polarity judging circuit and then the judgment result is multiplied by the ASK modulation signal, the polarity judging circuit can be made simple, and the ASK modulation signal can be demodulated. As a result, this ASK demodulating circuit can be simply and readily manufactured in the IC form together with other circuit blocks. Furthermore, such a demodulating circuit operable in a higher efficiency can be obtained.

ASK Demodulating Circuit of Twelfth Embodiment

Figure 36:
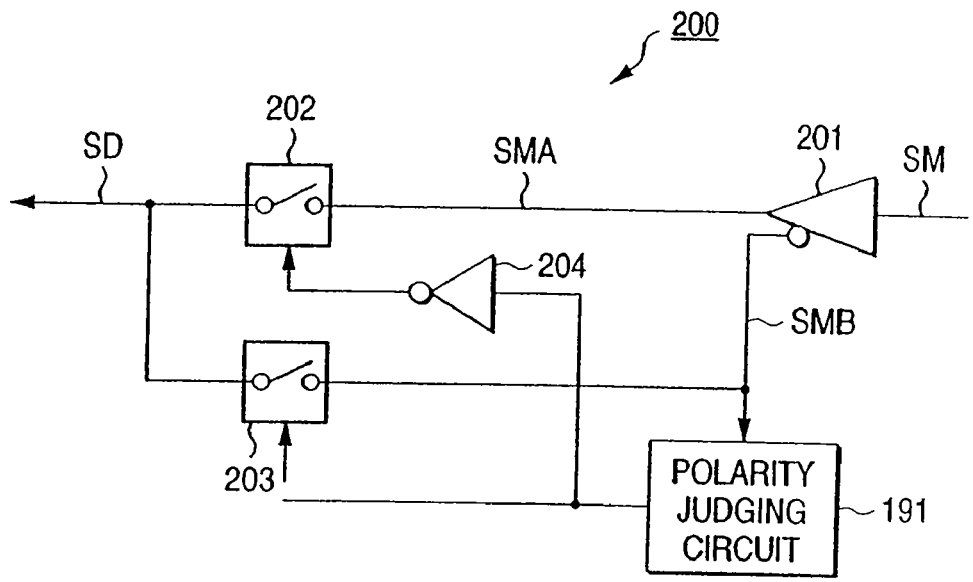
FIG. 36 is a schematic block diagram for showing a basic arrangement of a demodulating circuit applied to an IC card reader/writer, according to a twelfth embodiment of the present invention.

FIG. 36 is a block diagram for representing a basic arrangement of an ASK demodulating circuit according to an twelfth embodiment of the present invention. In this twelfth embodiment, this ASK demodulating circuit 200 is applied instead of the ASK detecting circuit 49 and the low-pass filter 50 (see FIG. 8).

This ASK demodulating circuit 200 outputs a similar demodulation result, namely the ASK modulation signal is rectified by the full wave rectification by such that a polarity of the ASK modulation signal SM is judged in the polarity judging circuit 191, and the ASK modulation signal SM is selectively outputted based upon this judgment result.

In other words, the demodulating circuit 200 produces an ASK modulation signal SMA having the same phase as that of the ASK modulation signal SM, and also another ASK modulation signal SMB having a phase opposite to that of the ASK modulation signal SM in an amplifying circuit 201. The demodulating circuit 200 intermittently outputs the ASK modulation signal SMB having the opposite phase via a switch circuit 203 based upon the judgment result of the polarity judging circuit 191. Furthermore, this demodulating circuit 200 intermittently outputs the ASK modulation signal SMA having the same phase via another switch circuit 202 based upon a reverse polarity signal of a judgment result obtained via an inverting amplifying circuit 204. As a result, this demodulating circuit alternately outputs the ASK modulation signal SMA and SMB in response to the polarity judgment result so as to full-wave-rectify the ASK modulation signal SM.

Figure 37:
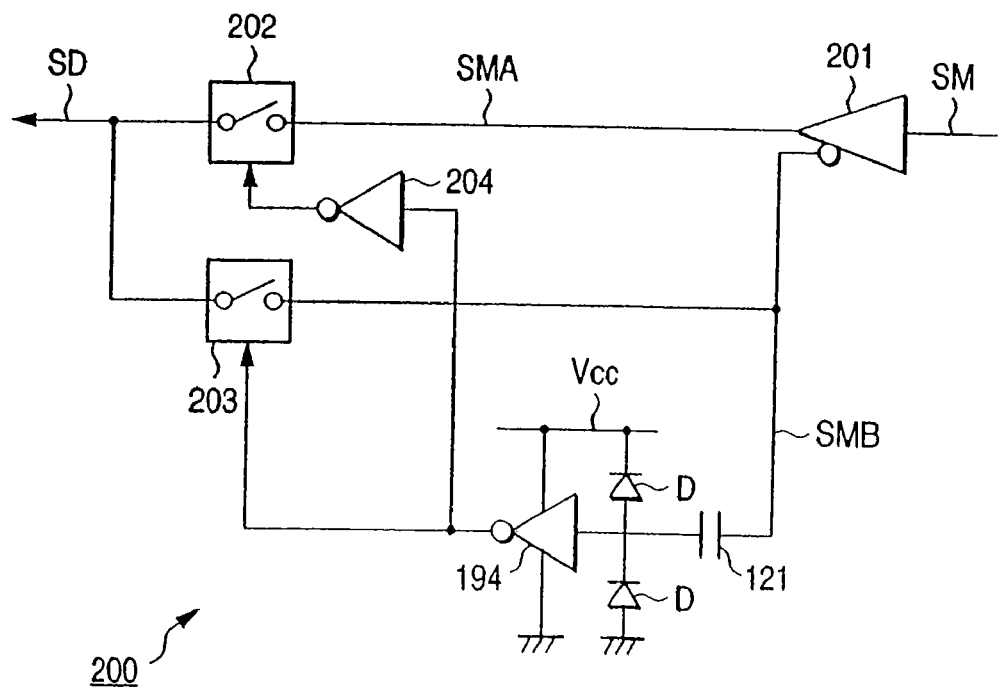
FIG. 37 is a schematic block diagram for indicating a concrete arrangement of the demodulating circuit shown in FIG. 36.

In further detail, in the ASK demodulating circuit 20 according to this twelfth embodiment, as represented in FIG. 37, since the polarity signal is produced by the polarity judging circuit similar to the above-described polarity judging circuit of FIG. 35, the demodulation signal SD is outputted.

Figure 38:
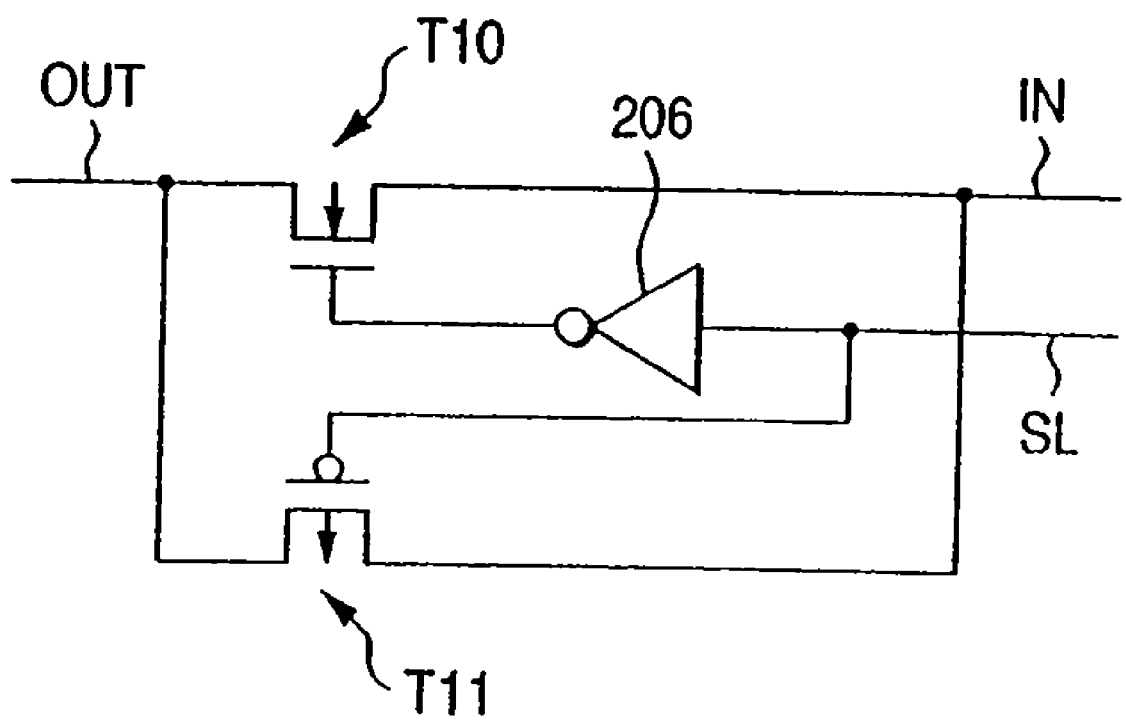
FIG. 38 is a connection diagram for representing a switch circuit of FIG. 37.

It should be understood that, as indicated in FIG. 38, this sort of switch circuit 202 and 203 may be realized in such a manner that a P-channel field-effect transistor T10 is connected in parallel to an N-channel field-effect transistor T11, and gate voltages of these transistors T10 and T11 are varied by an inverting amplifying circuit 206 in a complementary manner.

In accordance with the twelfth embodiment, since the polarity of the ASK modulation signal is judged by the polarity judging circuit and then, the ASK modulation signals are 1—1 selectively outputted based on this judgment result, the polarity judging circuit can be made simple, and the ASK modulation signal can be demodulated. As a result, this ASK demodulating circuit can be simply and readily manufactured in the IC form together with other circuit blocks. Furthermore, such a demodulating circuit operable in a higher efficiency can be obtained.

OTHER EMBODIMENTS

It should be understood that the above embodiments have described such a case where the modulation signal is produced by employing the carrier signal having the same frequency. The present invention is not limited thereto. Alternatively, a rectangular wave signal having a single frequency may be employed instead of the carrier signal. Also, both a phase modulation signal and a frequency modulation signal may be used so as to produce a modulation signal by way of a so-called "dual modulation". It should also be noted that when such a rectangular wave signal is employed so as to produce the modulation signal, for example, the inverting amplifier circuits 60 and 71 as explained in the first embodiment may be constituted by an inverter.

Also, in the specific arrangement of the first embodiment, the operation of the power amplifying circuit is intermittently stopped so as to gate the carrier signal. The present invention is not limited thereto. That is, as previously explained in the basic arrangement, the carrier signal may be gated by the switch circuit provided on the input side of the power amplifying circuit. In this alternative case, the switch circuit as previously explained with reference to FIG. 38 may be employed. Furthermore, a multiplexer arranged by a digital circuit arrangement may be used.

In addition, the output stage of the power amplifying circuit as the concrete arrangement of the first embodiment is arranged by the field-effect transistor. The present invention is not limited thereto. Alternatively, the output stage of the power amplifying circuit may be arranged by a bipolar type transistor.

Also, as the above-described specific arrangement of the first embodiment, one power-amplified result having the same phase is gated, and then this gated power-amplified result is added to the other power-amplified result having the same phase. The present invention is not limited thereto, for example, while one power-amplified result may be gated, this gated power-amplified result may be subtracted from the other power-amplified result. Also, while one power-amplified result having the reverse phase may be gated, the other power-amplified result may be added to this gated power-amplified result. Furthermore, while one power-amplified result having the reverse phase is gated, this gated power-amplified result may be subtracted from the other power-amplified result.

Also, in the second embodiment, the variable attenuator is arranged on the output side of the power amplifying circuit. The present invention is not limited thereto. Alternatively, for example, in a circuit arrangement operable by electric power received by an antenna, since an impedance of a power supply circuit is switched, a load is equivalently switched on the output side of the power amplifying circuit to constitute an attenuator.

Also, as to the specific arrangement of the second embodiment, the field-effect transistor is used as the switching element, the power-amplified results are attenuated. The present invention is not limited thereto. Alternatively, this switching element may be constituted by a bipolar type transistor, and a PIN diode.

Furthermore, in the above-explained embodiments, the IC card is operated by the electric power of the transmission signal. The present invention is not limited thereto. Alternatively, this IC may be operated by a battery and the like.

Also, in the above-described embodiment, the transmit data is modulated and/or demodulated by employing the Manchester code. The present invention is not limited thereto. Alternatively, the inventive idea of the present invention may be widely applied to a case that various sorts of codes other than the Manchester code are modulated/demodulated, another case being that a data stream having multi values is amplitude-modulated, or amplitude-demodulated, and a further case being that an analog signal such as an audio signal is amplitude-modulated, or amplitude-demodulated.

In the above embodiments, the inventive idea of the present invention is applied to the IC card and the IC card reader/writer. The present invention is not limited thereto. Alternatively, this inventive idea may be widely applied to various transmitter apparatuses and various receiver apparatuses.

As previously described in detail, the first and second output signals having predetermined phases with respect to the input signal are added to each other, and the added result is outputted. At least, the second output signal is gated in response to the input data. Also, on the output side of the power amplifying circuit, the power-amplified results are attenuated in accordance with the input data so as to produce the amplitude-modulated signal. This circuit arrangement can be simply and readily manufactured in the IC form together with other circuit blocks. Furthermore, it is also possible to obtain the modulating circuit operable in the higher efficiency, the amplifying circuit applicable to this modulating circuit, and also the transmitter apparatus with using this modulating circuit.

Also, since the amplitude-modulated signals are biased to be amplified, or clipped, the demodulating circuit and the receiver apparatus with using this demodulating circuit can be simply and easily manufactured in the IC form in combination with other circuit blocks.

Furthermore, the amplitude-modulated signals are clamped, the polarities of these amplitude-modulated signals are judged to multiply the polarity judgment result by the amplitude-modulated signals, and furthermore, the amplitude-modulated signals are selectively outputted based upon the polarity judgment results of the amplitude-modulated signals. As a result, the demodulating circuit and the receiver apparatus with using this demodulating circuit can be simply and readily manufactured in the IC form together with other circuit blocks.

The invention claimed is:

1. An amplifying circuit, comprising:

first variable resistor means, one end of which is held at a first potential and the resistance value of which is varied in response to a first control signal;

second variable resistor means, one end of which is connected to the other end of said first variable resistor means, the other end of which is held at a second potential different from said first potential and the resistance value of which is varied in response to a second control signal; and control means for switching a signal level of said first control signal and a signal level of said second control signal so as to switch a potential at a connection center point between said first variable resistor means and said second variable resistor means to another potential corresponding to said first and second potentials, and also so as to switch an impedance of said connection center point to a high impedance in response to both an input signal and a control signal.

2. An amplifying circuit as claimed in claim 1, wherein said first variable resistor means and said second variable resistor means are field-effect transistors.

3. An amplifying circuit as claimed in claim 2, wherein said control means switches the signal level of said first control signal and the signal level of said second control signal to a voltage higher than or equal to a source-to-drain voltage of said field-effect transistor.

* * * * *